(12) United States Patent
Ueno et al.

(10) Patent No.: US 7,068,518 B2
(45) Date of Patent: Jun. 27, 2006

(54) CIRCUIT BOARD DEVICE AND DESIGN SUPPORT DEVICE

(75) Inventors: Osamu Ueno, Hadano (JP); Hitoshi Arakaki, Isehara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 184 days.

(21) Appl. No.: 09/805,250

(22) Filed: Mar. 14, 2001

(65) Prior Publication Data

US 2001/0035799 A1   Nov. 1, 2001

(30) Foreign Application Priority Data

Mar. 14, 2000 (JP) ............................... 2000-71320
Mar. 6, 2001 (JP) ............................... 2001-62490

(51) Int. Cl.
H05K 7/02 (2006.01)
H05K 7/06 (2006.01)
H05K 7/08 (2006.01)
H05K 7/10 (2006.01)

(52) U.S. Cl. ...................................... 361/760; 361/794
(58) Field of Classification Search ............... 361/760, 361/777, 792–795, 780–784, 763–766; 333/12, 333/212, 219, 246–247, 136, 90; 174/255–256; 257/691

See application file for complete search history.

(56) References Cited

U.S. PATENT DOCUMENTS

| | | | | |
|---|---|---|---|---|
| 5,023,753 A | * | 6/1991 | Abe | ........................... 361/748 |
| 5,387,885 A | * | 2/1995 | Chi | .............................. 326/93 |
| 5,587,887 A | * | 12/1996 | Price et al. | ................... 361/794 |
| 5,898,576 A | * | 4/1999 | Lockwood et al. | ......... 174/255 |
| 5,912,809 A | * | 6/1999 | Steigerwald et al. | ....... 174/255 |
| 5,926,377 A | * | 7/1999 | Nakao et al. | ............... 174/255 |
| 6,002,593 A | * | 12/1999 | Tohya et al. | ................. 333/185 |
| 6,104,258 A | * | 8/2000 | Novak | ...................... 333/22 R |
| 6,166,457 A | * | 12/2000 | Iguchi et al. | ............... 174/250 |
| 6,198,362 B1 | * | 3/2001 | Harada et al. | ................ 333/12 |

FOREIGN PATENT DOCUMENTS

| | | |
|---|---|---|
| JP | A 09-283974 | 10/1997 |
| JP | A 10-112574 | 4/1998 |
| JP | A 11-054860 | 2/1999 |

OTHER PUBLICATIONS

Wheeler, Harold A. *Transmission-Line Properties of a Strip on a Dielectric Sheet on a Plane*. Oct. 29, 1976; revised Feb. 23, 1977.
Partial Translation of *Electromagnetic Wave Analysis Seminar*, Fujitsu Limited, Nov. 24, 2000.

* cited by examiner

*Primary Examiner*—Kamand Cuneo
*Assistant Examiner*—Tuan Dinh
(74) *Attorney, Agent, or Firm*—Oliff & Berridge, PLC

(57) ABSTRACT

A circuit board device suppress with a small number of terminal elements unwanted irradiation originating between a power supply layer and a ground layer, even when a configuration of the power supply layer and the ground layer on the circuit board is complex, and a design support device thereof. The circuit board device has a power supply layer and a ground layer disposed in opposition to one another. A dielectric is disposed between the power supply layer and the ground layer. A power supply surface is divided into two power supply surfaces and by a slit having a generally T-shaped configuration to form power supply surface edges. The power supply surface edges retain across a predetermined length L a characteristic impedance present between the power supply layer and the ground layer. A terminal load is connected to a terminal portion of the power supply surface edges.

9 Claims, 22 Drawing Sheets

F I G. 5
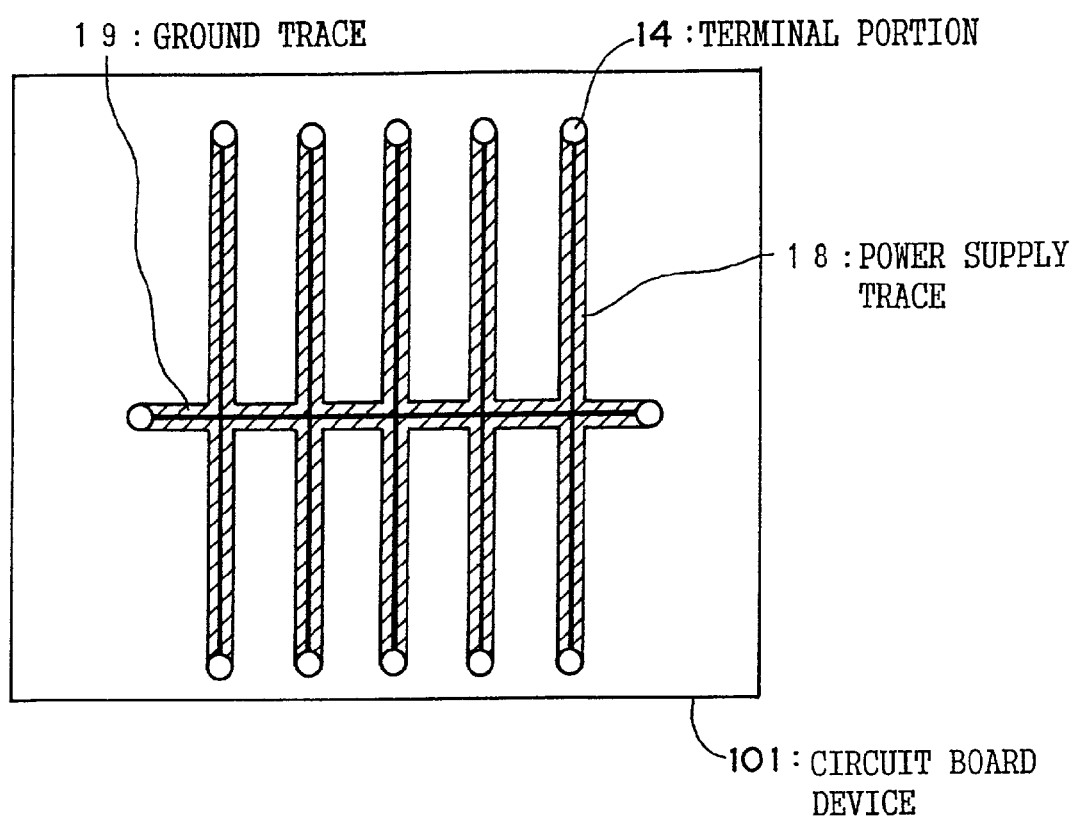

11A : POWER SUPPLY SURFACE

CURRENT

F I G. 7A
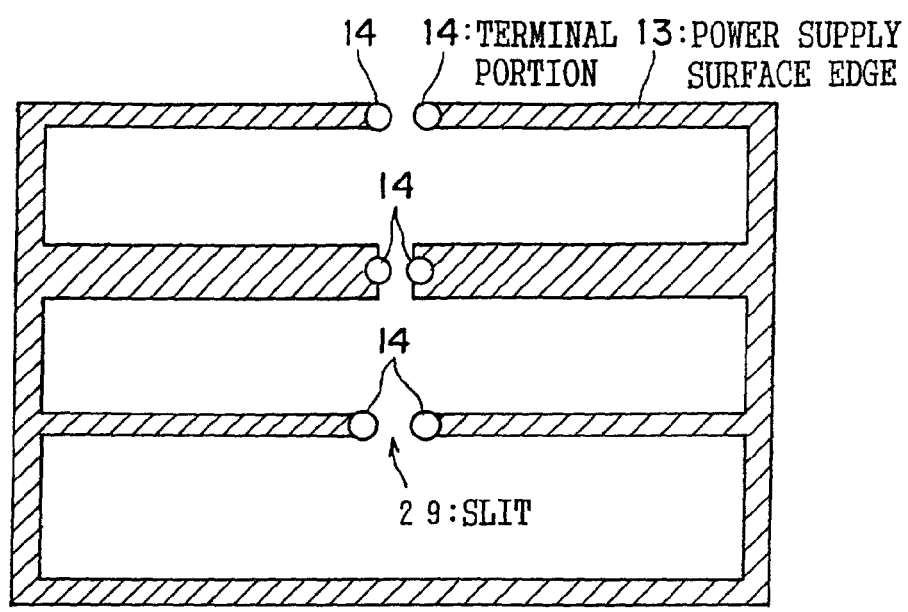
F I G. 7B
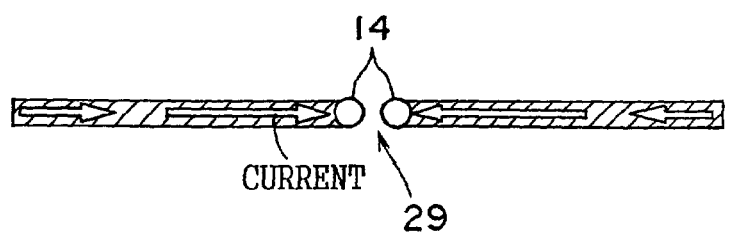

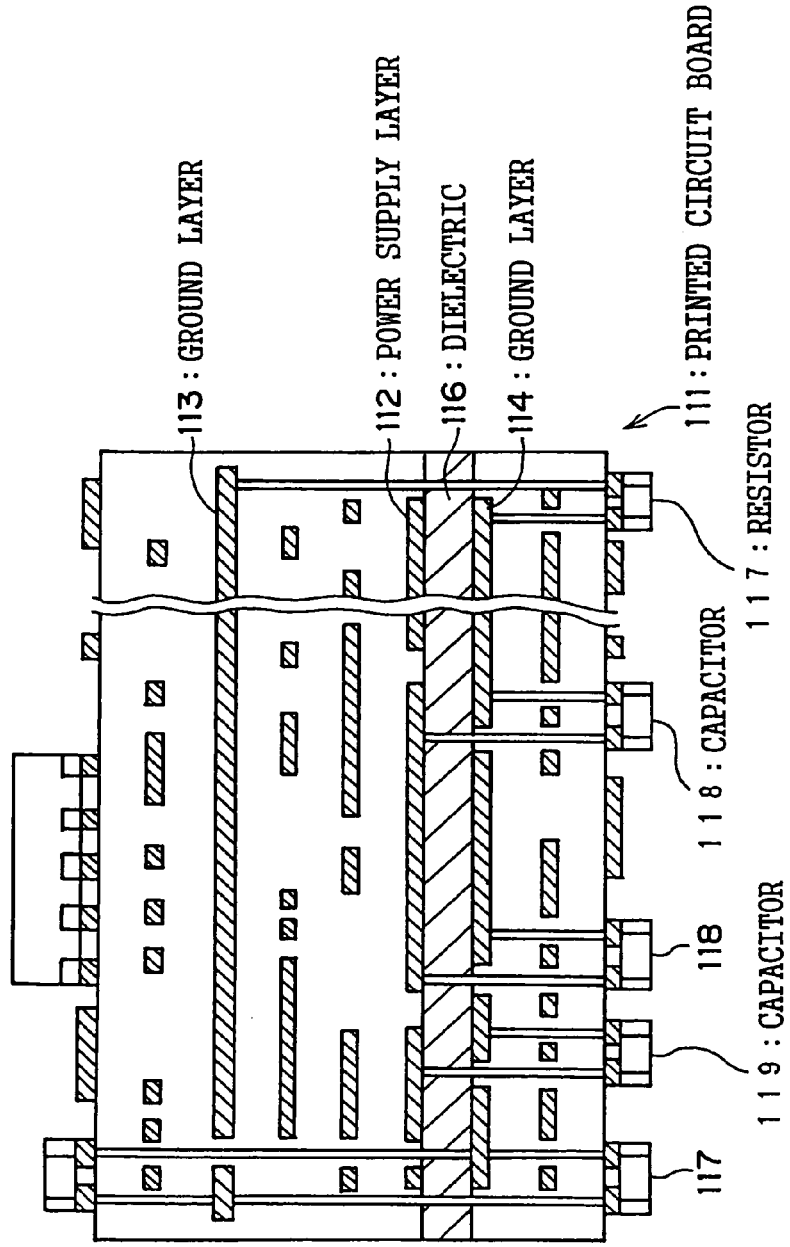

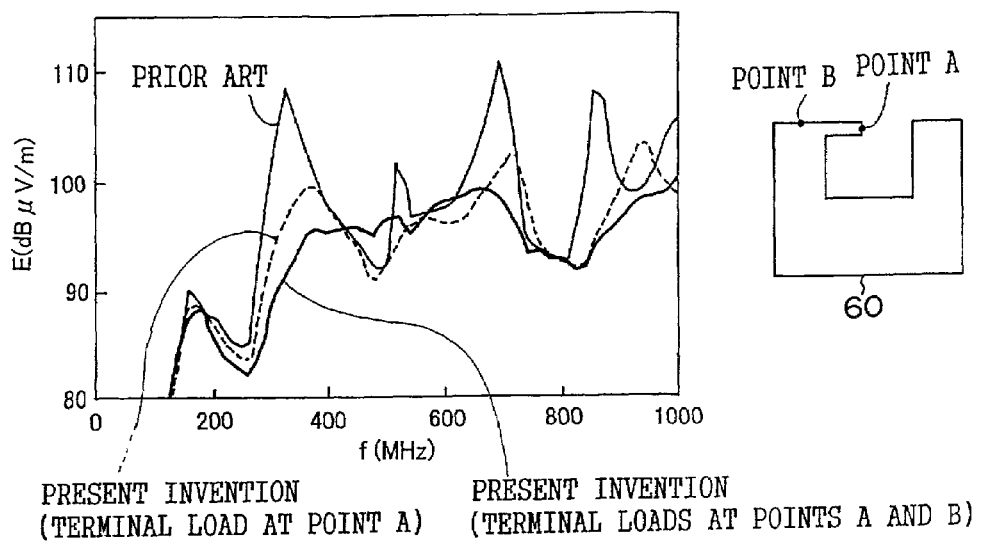
FIG. 21A
FIG. 21B
PRESENT INVENTION
(TERMINAL LOAD AT POINT A)
PRESENT INVENTION
(TERMINAL LOADS AT POINTS A AND B)
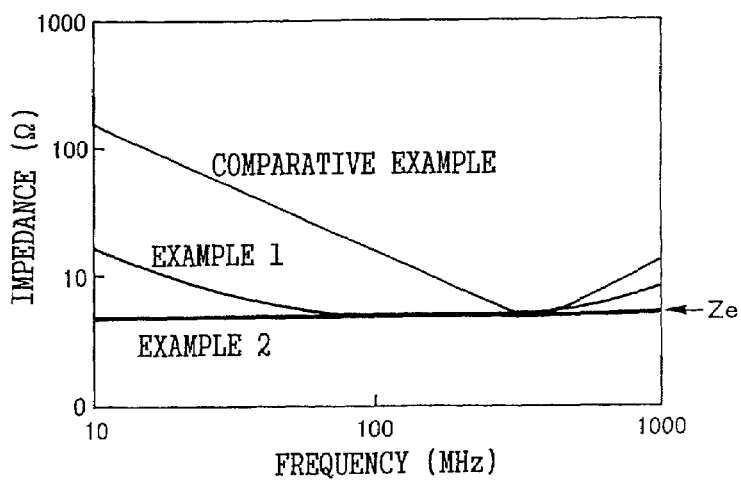
FIG. 22

CIRCUIT BOARD DEVICE AND DESIGN SUPPORT DEVICE

BACKGROUND OF THE INVENTION

1. Field of the Invention

The present invention relates to a circuit board device and a design support device. More specifically, the present invention relates to a circuit board device used in electronic equipment such as information equipment, and particularly to a structure for a circuit board device that can suppress electromagnetic radiation in a circuit board in which a power supply pattern and a ground pattern are formed, and a design support device thereof.

2. Description of the Related Art

Unwanted electromagnetic radiation has become a problem in recent years in various types of information equipment. The unwanted radiation is thought to stem from signal wires, or wires connected to signal wires, that transmit clock signals on a circuit board and digital signals synchronous with the clock signals. Filtering and damping resistance have come to be used on the signals as measures to counter the unwanted radiation.

Further, it has also come to be known in recent years that unwanted radiation is generated due to instability of the electric potential at the power supply system of the circuit board, and various methods for stabilizing electric potential have been proposed. An example of such a method includes providing a bypass capacitor in the IC power supply to absorb fluctuations in electric potential arising in the power supply system.

In addition, unwanted radiation due to electrical resonance of the power supply and ground surface is also generated in circuit boards having a power supply and ground surface that span the entire board.

As a countermeasure, Japanese Patent Application Laid-Open (JP-A) No. 10-112574 discloses a technology to suppress unwanted radiation by connecting, in addition to a capacitor connected between a digital IC power supply pin and a ground surface, a capacitor between the power supply and the ground surface at a circuit board end, and suppressing at the board end resonance current reflection distributed in the surface generated by electrical resonance between the power supply and the ground surface.

In actual circuit boards, however, there are cases in which, for example, the conductor surface in the power supply layer is divided into a plurality by slits or the like in order to use plural voltages. In such a case, the configuration of the conductor surface grows complex, the resonance current is not distributed evenly in the power supply and ground surface, and the current is concentrated at a portion where the conductor width narrows, whereby the circuit board becomes a source for electromagnetic radiation. For this reason, there are instances in which the effect is small even when a technology that suppresses unwanted radiation by connecting a capacitor between the power supply and the ground surface at the circuit board end is applied.

In order to solve this problem, JP-A No. 11-54860 discloses a technology in which, as illustrated in FIG. 12, terminal loads 102 are connected to a power supply/ground surface at peripheral edges of an inner power supply surface 101 when a power supply layer surface 100 is divided into two power supply surfaces.

Further, JP-A No. 9-283974 discloses a technology in which, as illustrated in FIG. 13, with respect to an all-over power supply surface or a plurally-divided power supply surface of a power supply layer 112 of a printed circuit board 111, in order to suppress unwanted radiation resulting from fluctuations in electric potential between the power supply layer 112 and a ground layer 113, another ground layer 114 is disposed opposite the ground layer 113 with the power supply layer 112 interposed therebetween, and in which resistors 117 are connected between the two ground layers, to thereby form an RC parallel circuit of the capacity constituents due to a dielectric 116 present between the power supply and ground layer and the resistors 117, whereby fluctuations in electric potential are absorbed.

In this case, it is preferable for the capacity resulting from the dielectric 116 present between the power supply/ground layer to be large in order to absorb more fluctuations in electric potential. Particularly, in the conventional art above, capacitors 118 and 119 are connected between the power supply/ground layer at each divided layer to increase capacity constituents between the layers when the power supply surface is divided into a plurality of power supply surfaces, because the power supply layer area is small and it is difficult to alter the material of the dielectric for each divided power supply surface.

However, in the technology disclosed in JP-A No. 11-54860, as illustrated in FIG. 12, the terminal loads 102 must be connected between the power supply and ground surface across the entire peripheral edge of the divided power supply surface 101. Thus, there has been the problem that the number of terminal loads 102 rises which takes up space on the board for connecting the terminal loads 102.

Further, in the technology disclosed in JP-A No. 9-283974, as illustrated in FIG. 13, two ground layers 113 and 114 are required to suppress unwanted radiation between the power supply layer and ground layer, and space for connecting resistors 117 between ground layer 113 and the ground layer 114 becomes necessary. Further, capacitors 118 for increasing capacity constituents between the power supply layer 112 and the ground layer 114 increase as the power supply pattern configuration increases in complexity.

SUMMARY OF THE INVENTION

The present invention was devised to solve the problems described above. It is an object of the present invention to provide a circuit board device and a design support device which can suppress, with a small number of terminal elements, unwanted radiation originating in a power supply/ground layer even in a case in which the configuration of the power supply/ground layer of the circuit board becomes complex.

In order to achieve this object, a circuit board device according to a first aspect of the present invention includes a power supply region and a ground region that are adjacent wherein, when at least one region of the power supply region and the ground region that are adjacent has a shape that may be considered a track, a terminal element having an impedance that is substantially equal to a characteristic impedance between said regions is connected between the power supply region and the ground region at a terminal portion vicinity of said at least one region.

Further, according to a second aspect of the present invention, the circuit board device may be structured such that the power supply region A and the ground region that are adjacent are formed in different layers with a dielectric layer interposed therebetween, substantially oppose one another, and overlap.

That is, the circuit board device having a power supply layer and a ground layer laminated together can be structured such that, for example, when a region at which regions formed at the power supply layer and the ground layer oppose one another and overlap may be considered a track configuration, a terminal element having a characteristic impedance that is substantially equal to a characteristic impedance between said regions of the power supply layer and ground layer in the regions that overlap is connected at a terminal portion vicinity of the regions that overlap and between the power supply layer and the ground layer.

In this case, the circuit board device has at least a power supply layer and ground layer laminated together. For example, in the case of a four-layer board, a wiring layer, a power supply layer, a ground layer and a wiring layer are sequentially laminated in this order. Further, each layer is laminated with, for example, an isolated dielectric interposed therebetween.

Such a circuit board device has a predetermined width in which regions formed at the power supply layer and the ground layer oppose one another and regions that overlap may be considered a track configuration. That is, by dividing the power supply layer into a predetermined pattern configuration to supply different power supply voltages, for example, overlapping regions having a long and narrow track configuration of a predetermined length are formed at the predetermined width. The region that forms a track refers at least to a shape having a length that is larger than a width, e.g., a shape having a length that is twice the size of a width. Further, the region that may be considered a track is not limited to simply a shape having a long and narrow track configuration but may also include, for include, a shape having a peninsular configuration from which a portion of a region having a comparatively large area projects.

Because a noise current that flows through the power supply layer and ground layer is thought to behave as if the pattern of the power supply layer and the pattern of the ground layer in the overlapping region having the track configuration were transmission paths, a terminal element (i.e., terminal load) having an impedance that is substantially equal to the characteristic impedance (resistance constituents at a high frequency) formed between the regions of the power supply layer and the ground layer in the overlapping region is connected at a terminal portion vicinity of the overlapping region having the track configuration and between the power supply layer and the ground layer. It should be noted that the terminal element may also be connected at an inner side of the board and not just the edge area of the board as long as the connection is made at a terminal portion in the lengthwise direction of the overlapping region.

Here, a characteristic impedance Ze formed between the pattern of the power supply layer and the pattern of the ground layer in the overlapping region can be expressed, for example, by equation (1) below when W is a width that is narrower of the pattern of the power supply layer and the pattern of the ground layer in the overlapping region having the track configuration, h is a distance between the pattern of the power supply layer and the pattern of the ground layer in the overlapping region having the track configuration, and $\epsilon_r$ is a relative dielectric constant of the dielectric interposed between the power supply layer and the ground layer.

$$Z_e = \frac{30}{\sqrt{\varepsilon_{ref}}} \ln\left[1 + \frac{4h}{w}\left\{\frac{8h}{w} + \sqrt{\left(\frac{8h}{w}\right)^2 + \pi^2}\right\}\right] \quad (1)$$

However, $$\varepsilon_{ref} = \frac{\varepsilon_r + 1}{2} + \frac{\varepsilon_r - 1}{2} \cdot \frac{1}{\sqrt{1 + \frac{10h}{w}}} \quad (2)$$

(Source: Wheeler, Harold A., "Transmission-Line Properties of a Strip Line On a Dielectric Sheet on a Plane," *IEEE Transactions on Microwave Theory and Techniques*, Vol. MTT-25, No. 8, p. 631, August, 1977).

By connecting a terminal element having an impedance that satisfies, for example, the above equation (1) at a terminal portion of the overlapping region having a predetermined length at a predetermined width and between the power supply layer and ground layer, noise current reflectance concentrating at portions of the track configuration at which the width becomes narrower can be suppressed, and thus electromagnetic radiation can be suppressed. Therefore, it becomes unnecessary to connect many terminal loads between the power supply layer and the ground layer, and a reduction in the regions of mountable portions on the circuit board can be prevented.

It should be noted that the above equation (1) is an expression for a microstrip structure. However, the characteristic impedance Ze can be determined by using an expression for a strip structure when the power supply surface is interposed between two ground surfaces.

In addition, the characteristic impedance Ze may also be calculated from the sectional form of the overlapping portion using a numerical method of calculation such as a finite element method and a boundary element method.

According to a third aspect of the present invention, the circuit board device may also be structured such that a circuit having a plurality of via holes that forms a parallel circuit is formed at the terminal portion vicinity, with the terminal element being connected between the layers via the parallel circuit. Namely, the power supply layer and the terminal element are connected at the plurality of via holes that are parallel-connected, and the ground layer and the terminal element are connected at the plurality of via holes that are parallel-connected. Because the power supply layer and the ground layer are connected in this manner via the terminal element by the plurality of via holes, inductance constituents can be reduced. It should be noted that via holes generally refer to inter-layer connecting materials including through-holes.

According to a fourth aspect of the present invention, the power supply region and the ground region that are adjacent may also be formed in the same layer. That is, when the power supply region and the ground region are adjacent at a single layer, and at least one region of the power supply region and the ground region has a shape that may be considered a track, this inter-region can be treated the same as when the power supply region and the ground region are formed in different layers with a dielectric layer interposed therebetween. In this case, the characteristic impedance Ze can be determined, for example, from the sectional shape of the circuit board device in a direction orthogonal to the track direction using a known numerical method of calculation such as the finite element method.

According to a fifth aspect of the present invention, a capacitor can be used at the terminal element at which the impedance becomes substantially equal to the characteristic impedance Ze of the above expression (1), so that the power supply layer and the ground layer do not short circuit at high-frequency regions. When no terminal element is provided, impedance at the terminal portion becomes infinite, and large differences between the impedance at the terminal portion and the characteristic impedance Ze of the overlapping region having the track configuration arise, whereby a large reflectance is created. In contrast, by using a capacitor at the terminal element, impedance in high-frequency regions drops and a terminal element impedance that is substantially equal to the characteristic impedance Ze at a specific frequency range can be obtained.

Further, according to a sixth aspect of the present invention, the circuit board device may also be structured so that the terminal element includes a resistor and a capacitor which are series-connected. Accordingly, terminal portion impedance can be held by the resistor to a constant at a wide frequency range, and a direct current can be prevented from flowing between the power supply layer and the ground layer at the capacitor series-connected to the resistor. Consequently, it becomes possible to substantially match the impedance Zr of the terminal element to the characteristic impedance Ze at a frequency range that is wider than that of a case in which only the capacitor is used at the terminal element. Moreover, there is also an effect in that noise energy is converted to heat by using a resistor. Thus, the effect of reducing electromagnetic radiation noise becomes greater.

It should be noted that the terminal element is not limited to the series-connected capacitor and resistor as long as the element has an impedance that is substantially equal to the characteristic impedance.

The impedance Zr of the terminal load can be expressed by equation (3) below when a capacity of the capacitor is C farads, a resistance is R ohms, and a frequency is f hertz.

$$Z_r = \sqrt{R^2 + \left(\frac{1}{2\pi f c}\right)^2} \qquad (3)$$

From equations (1) and (3), the resistance R that becomes $Z_e = Z_r$ is represented by equation (4) below.

$$R = \sqrt{Ze^2 - \left(\frac{1}{2\pi f c}\right)^2} \qquad (4)$$

By series-connecting the capacitor and the resistor having the resistance R determined in this manner, for example, a terminal load having a desired inductance value can be structured.

Further, when the terminal loads are provided, a plurality of terminal loads may be combined in parallel. For example, two loads having the same inductance may be used as the terminal loads. In this case, an impedance per terminal load can be determined by substituting W/2 in equation (1) when the width of the overlapping region having the track configuration is W.

According to a seventh aspect of the present invention, the region that may be considered a track is a shape having a length that is larger than a width.

Although electromagnetic radiation noise can be reduced the greatest when the impedance Zr of the terminal element is completely equal to the characteristic impedance Ze of the terminal portion vicinity, electromagnetic radiation noise can be reduced not only when the two are completely equal but also when the two are only substantially equal.

Because impedance is infinite when no terminal element is provided and has the largest reflectance, something of an effect of reducing reflectance is produced by only providing the terminal element. However, according to an eighth aspect of the present invention, when the impedance Zr of the terminal element is set so that the characteristic impedance Ze and the impedance Zr of the terminal element satisfy a relationship of $0.1 \leq Zr/Ze \leq 10$, the effect of reducing electromagnetic radiation noise becomes particularly large. Namely, a range in which the characteristic impedance Ze of the overlapping region that may be considered a track configuration and the impedance Zr of the terminal element satisfy the relationship $0.1 \leq Zr/Ze \leq 10$ can be made into a range in which the characteristic impedance Ze of the overlapping region that may be considered a track configuration and the impedance Zr of the terminal element are substantially equal.

According to a ninth aspect of the present invention, a relationship between the characteristic impedance Ze and the resistance R of the resistor satisfies $(Ze/5) \leq R \leq (5 \cdot 7 \text{ e})$, and a capacity C of the capacitor satisfies $C \geq 1/(10\pi \cdot f_{min} \cdot Ze)$, where $f_{min}$ is a lower limit of a radiation noise frequency of a reduction target. Therefore, electromagnetic radiation noise can be reduced across a wide frequency range.

In a tenth aspect of the present invention, there is provided a design support device for a circuit board device having a power supply region and a ground region, the design support device comprising: a design information database for storing design information of the circuit board device; extraction means for extracting, on the basis of the design information database, a region that may be considered a track, said region being at least one region of the power supply region and the ground region that are adjacent; and calculation means for determining a characteristic impedance between said at least one region that may be considered a track and another region.

According to this invention, a design information database for storing design information of the circuit board device is provided. The design information includes, for example, region information structured by three-dimensional coordinate information and the like, and attribute information for indicating whether the region represented by the region information is a power supply region or a ground region, and the like.

On the basis of this design information database, the extraction means extracts a region that may be considered a track, the region being at least one region of the power supply region and the ground region that are adjacent (i.e., the extraction means extracts a region having the potential to emit electromagnetic radiation noise).

Further, the calculation means determines the characteristic impedance of the region that may be considered a track. Specifically, the calculation means determines a width W of the region that may be considered a track and that is extracted by the extraction means, and determines a distance h between the power supply layer and the ground layer in this region. Taking these and the relative dielectric constant of the dielectric interposed between the power supply layer and the ground layer as $\epsilon_r$, the calculation means determines the characteristic impedance using, for example, the aforementioned equation (1).

Because the characteristic impedance can be calculated by automatically extracting from the design information database a region that may be considered a track, which region has the potential to emit electromagnetic radiation noise, the design of the circuit board device becomes easy and design labor can be greatly reduced.

Further, according to an eleventh aspect of the present invention, the design support device may further comprise a parts information database for storing parts information of a terminal element for connection at a terminal portion vicinity of the region that may be considered a track and between the power supply region and the ground region, and search means for searching from the parts information database terminal elements having an impedance that is substantially equal to the characteristic impedance calculated by the calculation means.

According to this invention, there is provided a parts information database for storing parts information of a terminal element for connection at a terminal portion vicinity of the region that may be considered a track and between the power supply region and the ground region. The parts information database is structured to include, for example, information (resistance, capacity) relating to the impedance and size of parts used as the terminal element such as resistors and capacitors.

The search means searches from the parts information database a terminal element having an impedance that is substantially equal to the characteristic impedance calculated by the calculation means.

Because the terminal element connected to the region that may be considered a track is automatically searched, design of the circuit board device becomes even easier.

Moreover, in accordance with a twelfth aspect of the present invention, the design support device may be structured so that the extraction means includes a conversion means for extracting a region in which the power supply region and the ground region are formed in different layers with a dielectric layer interposed therebetween, oppose one another and overlap, and for converting the extracted region into a region having a simplified shape, the extraction means extracting from the region having a simplified shape a region that may be considered a track.

According to this invention, the conversion means extracts a region in which the power supply region and the ground region are formed in different layers having a dielectric layer interposed therebetween, oppose one another and overlap, and converts the extracted region into a region having a simplified shape. For example, the conversion means converts the region so that a contour of the extracted region is formed only by straight lines in two directions that are mutually orthogonal. Further, the extraction means extracts a region that may be considered a track from the region having the simplified shape. Accordingly, the region that may be considered to have the track configuration can easily be extracted, and the amount of calculation required for the extraction can be reduced.

According to a thirteenth aspect of the present invention, the design support device may be structured such that the terminal element includes a resistor and a capacitor which are series-connected, and the search means searches for a resistor in which a relationship between the characteristic impedance Ze and a resistance R satisfies $(Ze/5) \leq R \leq (5 \cdot Ze)$ and searches for a capacitor in which a capacity C satisfies $C \geq 1/(10\pi \cdot f_{min} \cdot Ze)$, where $f_{min}$ is a lower limit of a radiation noise frequency of a reduction target.

According to a fourteenth aspect of the present invention, the search means searches for a resistor and a capacitor that satisfy $L_0 \leq 5 \cdot Z/(2\pi \cdot f_{max})$, where $L_0$ is an inductance constituent present within the resistor, capacitor, and a connection pattern connecting the resistor to the capacitor, and $f_{max}$ is a frequency upper limit of radiation noise of a reduction object.

BRIEF DESCRIPTION OF THE DRAWINGS

FIG. 5 is a schematic plan view of the circuit board device pertaining to the third embodiment of the present invention.

FIG. 7A is a schematic plan view of the circuit board device pertaining to the third embodiment of the present invention.

FIG. 7B is a drawing to describe a current flow.

FIG. 13 is a schematic plan view of a conventional circuit board device.

FIG. 21A is a chart illustrating a relationship between a frequency of electromagnetic radiation noise and radiation intensity.

FIG. 21B is a chart illustrating a relationship between a frequency of electromagnetic radiation noise and radiation intensity.

FIG. 22 is a chart illustrating impedance spectrals.

DESCRIPTION OF THE PREFERRED EMBODIMENTS

First Embodiment

A first embodiment of the present invention will now be described with reference to drawings.

Figure 1:
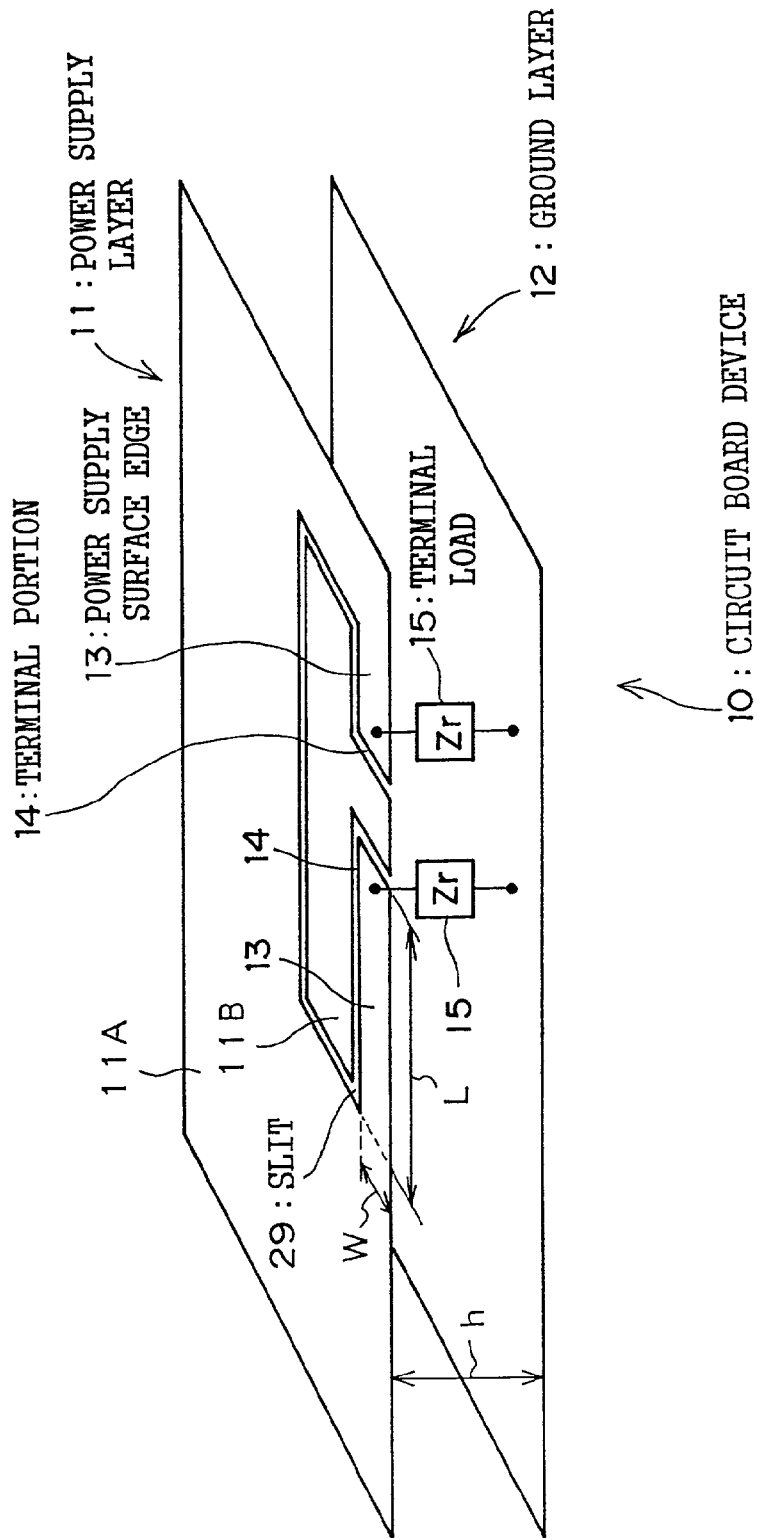
FIG. 1 is a schematic perspective view of a circuit board device pertaining to a first embodiment of the present invention.

FIG. 1 shows a schematic structure of a circuit board device 10, for electrical equipment, pertaining to the present invention. As illustrated in FIG. 1, the circuit board device 10 has a power supply layer (power supply region) 11 and a ground layer (ground region) 12 disposed in opposition to one another with a fixed distance interposed therebetween. A dielectric (not shown) is provided between the power supply layer 11 and the ground layer 12.

The power supply layer 11 is divided into two power supply surfaces 11A and 11B by a slit 29 having a generally T-shaped configuration. Since the slit 29 has a generally T-shaped configuration, power supply surface edges 13 are formed in a track configuration as regions of the power supply surface 11A that overlap with the ground layer 12.

Because the power supply surface edges 13 have a track configuration as shown in FIG. 1, characteristic impedance formed between the power supply surface edge 13 and the ground surface 12 is retained across a predetermined length L. Further, at terminal portions 14 of the power supply surface edges 13, terminal loads 15 that have an impedance value equal to that of the characteristic impedance are connected between the power supply surface edges 13 and the ground surface 12. Here, by track configuration is meant, when a length of the power supply surface edge 13 is L and a width of the same is W, the value of the length L is, for example, at least equal to the value of the width W or greater (i.e., L≧W). Further, in addition to a long and narrow track configuration, the phrase track configuration is also meant to include a peninsular configuration.

It is thought that a noise current flowing through the power supply layer 11 and the ground layer 12 behaves as if the pattern of the power supply layer 11 and the pattern of the ground layer 12 were transmission paths. A characteristic impedance Ze formed between the pattern of the power supply layer 11 and the pattern of the ground layer 12 can be expressed as the aforementioned equation (1) when the narrower width of the supply layer 11 pattern and the ground layer 12 pattern (in FIG. 1, the width of the power supply surface edge 13) is W, a distance between the power supply layer 11 pattern and the ground layer 12 pattern is h, and a relative dielectric constant of the dielectric (not shown) disposed between the power supply layer 11 and the ground layer 12 is $\epsilon_r$. Therefore, an impedance Zr of the terminal loads 15 is set to be equal to the characteristic impedance Ze expressed by equation (1).

The circuit board device 10 structured in this manner is not one in which, as conventionally has been the case, a capacitor is connected between the power supply layer and the ground layer across the entire power supply layer periphery of the circuit board. Rather, a fixed characteristic impedance is formed across a predetermined length between a pattern of the power supply layer 11, having a width that differs depending on the place, and a pattern of the ground layer 12. Terminal loads 15 having an impedance value equal to the characteristic impedance are connected at longitudinal direction terminal portions 14 of portions retaining the characteristic impedance. Therefore, reflectance of the noise current concentrated at portions at which the conductor width becomes narrow can be suppressed, and electromagnetic radiation generated by this can be suppressed. Further, it becomes unnecessary to connect many terminal loads 15 between the power supply layer 11 and the ground layer 12, and it is possible to prevent regions of mountable portions on the circuit board from being reduced.

Second Embodiment

A second embodiment of the present invention will now be described. In the second embodiment, description will be given of a specific example of the circuit board device described in the first embodiment.

Figure 2:
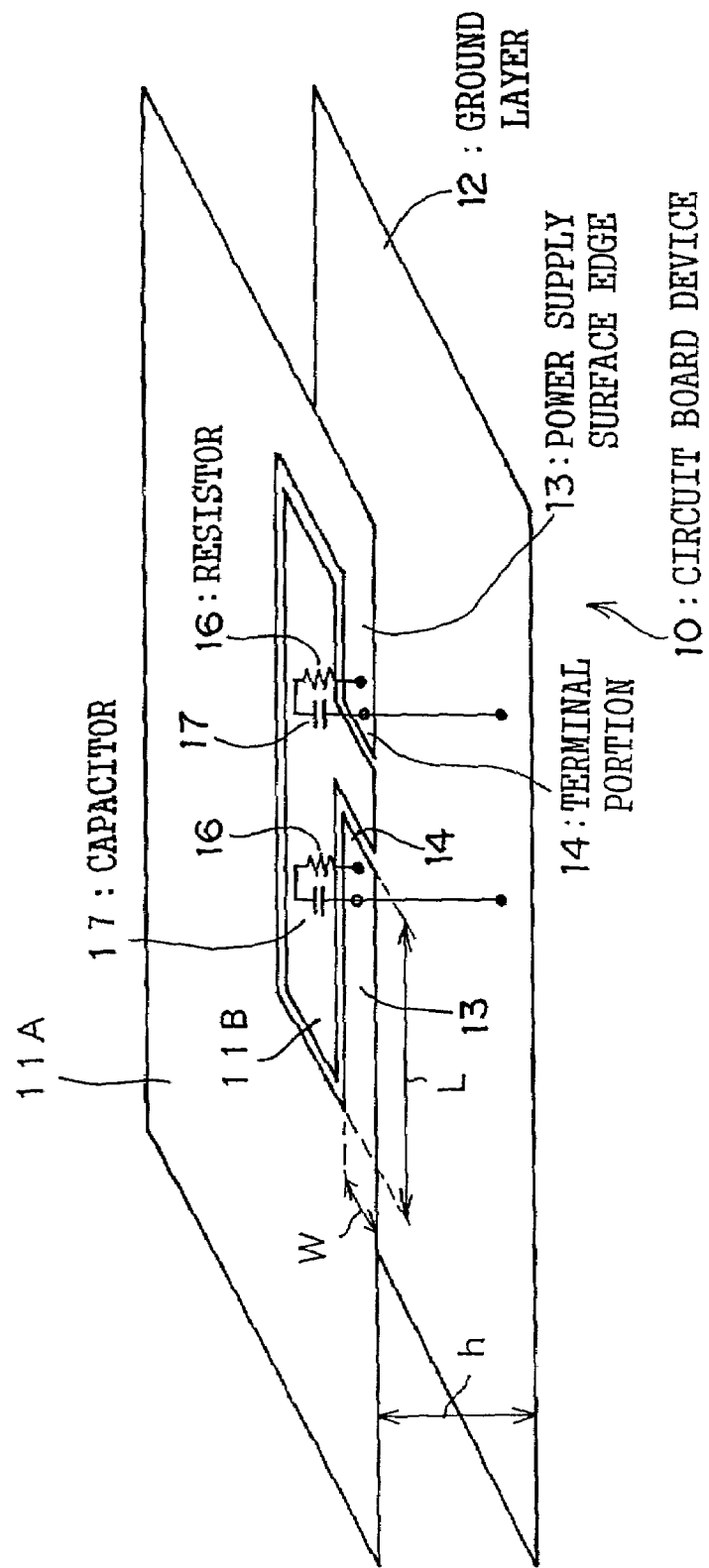
FIG. 2 is a schematic perspective view of a circuit board device pertaining to a second embodiment of the present invention.

As shown in FIG. 2, each terminal load 15 of the circuit board device 10 is formed by a resistor 16 and a capacitor 17.

Figure 3A:
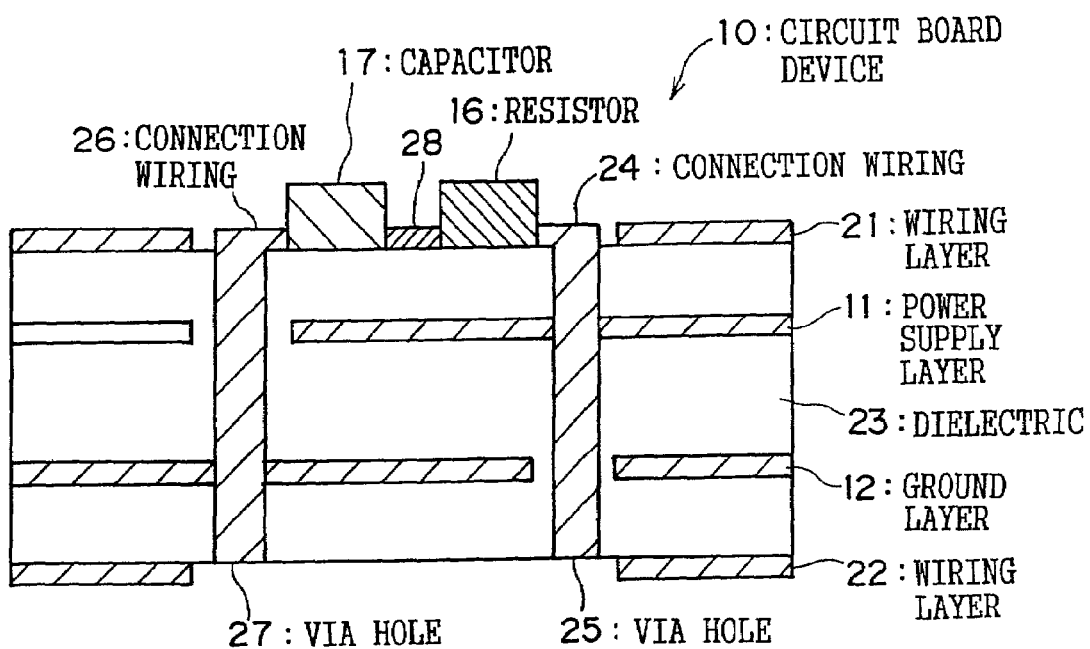
FIG. 3A is a sectional view illustrating a specific structure of the circuit board device pertaining to the second embodiment of the present invention.
Figure 3B:
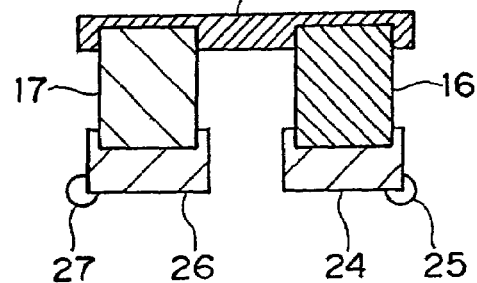
FIG. 3B is a plan view of the structure of the circuit board device illustrated in FIG. 3A.
Figure 3C:
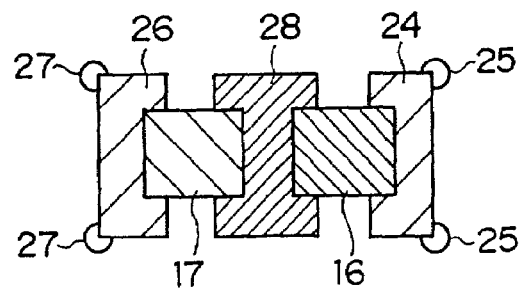
FIG. 3C is a plan view of an alternative example of the circuit board device illustrated in FIG. 3A.

FIG. 3A shows a sectional view of connecting portions of the capacitor 17 and resistor 16 of the circuit board device 10. FIGS. 3B and 3C show plan views of series-connected portions of the capacitor 17 and the resistor 16 seen from above.

As shown in FIG. 3A, the circuit board device 10 is formed by, for example, a four-layered, wired board and has a power supply layer 11 formed by a planar, metallic conductor, a ground layer 12, and wiring layers 21 and 22 having wiring patterns formed thereon. Further, a dielectric 23 is disposed between the respective layers.

As shown in FIG. 2, in the circuit board device 10, the power supply layer 11 is divided into a power supply surface 11A and a power supply surface 11 B by a slit 29. Since the slit 29 has a generally T-shaped configuration, power supply surface edges 13 of the power supply surface 11A have a track configuration.

Furthermore, as shown in FIG. 2, because the power supply surface edges 13 have a track configuration, characteristic impedance formed between the power supply surface edge 13 and the ground surface 12 is retained across a predetermined length L. At terminal portions 14 of the power supply surface edges 13, an RC series circuit of the resistor 16 and capacitor 17 is connected in series between the power supply surface edges 13 and the ground surface 12 as terminal loads 15 having an impedance value equal to the characteristic impedance.

As shown in FIG. 3A, one end of the resistor 16 is connected to a connection wiring 24 formed on the board. The connection wiring 24 is connected to a via hole 25 that passes through the board, and the via hole 25 is connected to the power supply layer 11. In this manner, one end of the resistor 16 is connected to the power supply source 11 via the connection wiring 24 and the via hole 25.

One end of the capacitor 17 is connected to the connection wiring 26. The connection wiring 26 is connected to the via hole 27, and the via hole 27 is connected to the ground layer 12. In this manner, one end of the capacitor 17 is connected to the ground layer 12 via the connection wiring 26 and the via hole 27.

As shown in FIG. 3B, the other end of the resistor 16 and the other end of the capacitor 17 are connected by connection wiring 28. Accordingly, the resistor 16 and the capacitor 17 are connected in series between the power supply layer 11 and the ground layer 12.

In this case, an impedance Zr of the terminal loads structured by the RC series circuit of the resistor 16 and the capacitor 17 can be obtained from the aforementioned equation (3) when a capacity of the capacitor 17 is C farads, a resistance of the resistor 16 is R ohms, and a frequency is f hertz. The value of resistance R that becomes $Z_e = Z_r$ can be obtained from the aforementioned equation (4).

The circuit board device 10 structured in this manner is not one in which, as conventionally has been the case, a capacitor is connected between the power supply layer and the ground layer across the entire power supply layer periphery of the circuit board. Rather, a fixed characteristic impedance is formed to span a predetermined length between the pattern of the power supply layer 11 and the pattern of the ground layer 12 having widths that differ depending on the place. The RC series circuit structured by the resistor 16 and capacitor 17 having an impedance value equal to the characteristic impedance is connected at terminal portions 14 in the longitudinal direction of portions retaining the characteristic impedance. Therefore, reflectance of the noise current concentrated at portions at which the conductor width becomes narrow can be suppressed, and electromagnetic radiation generated by this can be suppressed. Further, it becomes unnecessary to connect many RC series circuits between the power supply layer 11 and the ground layer 12, and it is possible to prevent regions of mountable portions on the circuit board from being reduced.

Further, as illustrated in FIG. 3C, a plurality of via holes 25 and 27 may be provided respectively. That is, the power supply layer 11 and the RC series circuit structured by the resistor 16 and the capacitor 17 are connected at the plurality of parallel-connected via holes 25, and the ground layer 12 and the RC series circuit are connected at the plurality of parallel-connected via holes 27. By the power supply layer 11 and the ground layer 12 being connected to the RC series circuit by the plurality of parallel-connected via holes 25 and 27, i.e., by being connected between the layers via the terminal loads, impedance constituents can be reduced. Here, via holes generally refer to inter-layer connecting materials including through-holes.

It should be noted that, in the present embodiment, description has been given of a structure in which the resistor 16 and the capacitor 17 are series-connected as the terminal loads 15. However, the present invention is not limited to the same. The terminal load 15 may consist only of the capacitor 17. Moreover, the terminal load 15 is not limited to an element attached to the outside of the board, such as the resistor 16 and the capacitor 17, but may also be integrated with the board itself.

Third Embodiment

A third embodiment of the present invention will now be described. In the third embodiment, description will be given of examples of altered forms of the circuit board device described in the first and second embodiments.

Figure 4A:
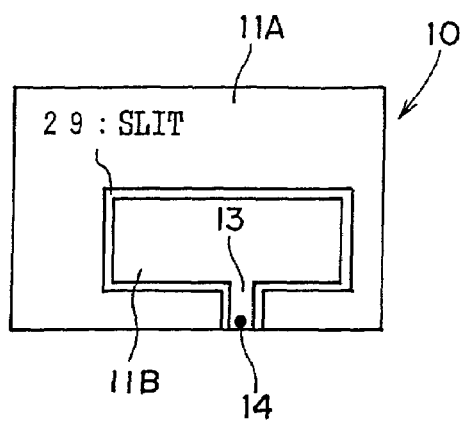
FIGS. 4A through 4E are schematic plan views of a circuit board device pertaining to a third embodiment of the present invention.

In the first and second embodiments, description was given of a case in which the power supply layer 11 is divided into two power supply surfaces 11A and 11B by the slit 29, and in which the present invention is applied only to the outer power supply surface 11A. However, as shown in FIG. 4A, at the inner power supply surface 11B, terminal loads 15 may be connected between the power supply surface 11B and the ground layer 12 at a terminal portion 14 of a power supply surface edge 13 that retains a fixed characteristic impedance at a fixed length. Further, terminal loads 15 may be connected to both the outer power supply surface 11A and the inner power supply surface 11B.

Figure 4B:
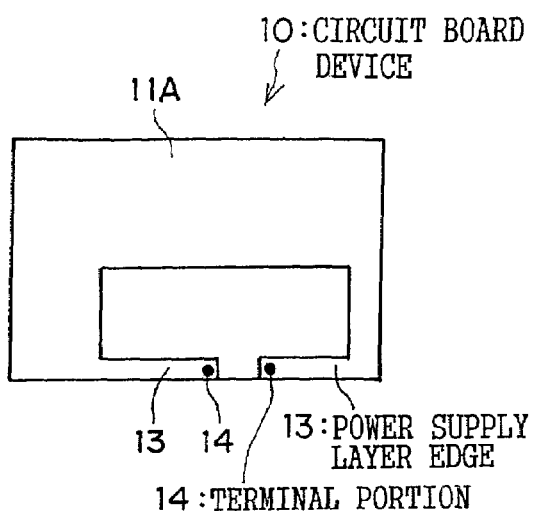

Furthermore, the present invention may also be applied to a case in which the power supply layer 11 is not divided by the slit 29 but, as shown in FIG. 4B, power supply surface edges 13 having a track configuration are formed by leaving out an inner portion of the power supply layer 11 to have a fixed impedance at only a fixed length.

In this case, as shown in FIG. 4B, terminal loads 15 are connected between the power supply surface 11 and the ground layer 12 at terminal portions 14 of the power supply surface edges 13 formed by the omission of the inner portion of the power supply layer 11. In this case also, terminal loads having a impedance that satisfies the value indicated in the above equation (1) are connected.

Figure 4C:
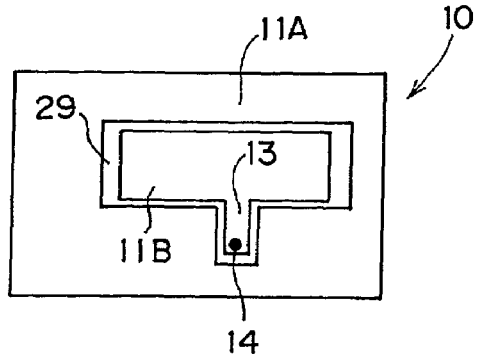

Further, as shown in FIG. 4C, even in a case in which the slit 29 forms a closed line (i.e., a case in which the slit 29 does not communicate with an outer edge of the power supply surface 11) and the inner power supply surface 11B has a portion having a fixed impedance at only a fixed length, electromagnetic radiation can be prevented by connecting a terminal load at the terminal portion 14.

Figure 4D:
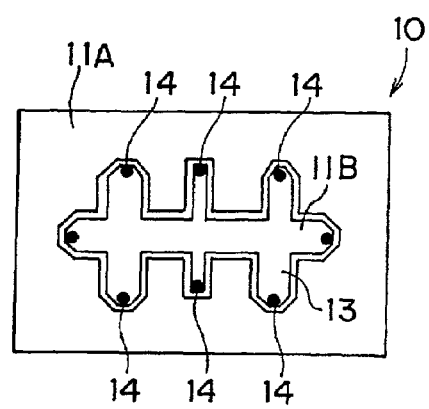

Yet further, as shown in FIG. 4D, when a plurality of portions having at only a fixed length terminal portions having a fixed impedance is provided at the inner power supply surface 11B that is divided by the slit 29, so that respective portions have different impedance values (i.e., when the widths of the power supply surface edges 13 are respectively different), terminal loads having an impedance that satisfies the aforementioned equation (1) may be connected to respective terminal portions 14 of the power supply surface edges 13.

Figure 4E:
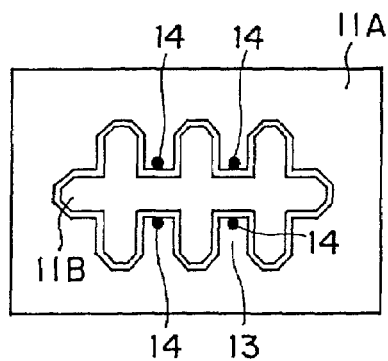

Although in FIG. 4D the present invention is applied only to the inner power supply surface 11B, the present invention may also be applied to the outer power supply surface 11A, as shown in FIG. 4E, in which a plurality of portions having at only a fixed length portions having a fixed impedance are provided so that respective portions have different impedance values. Moreover, the present invention may also be applied to both the outer power supply surface 11A and the inner power supply surface 11B.

FIG. 5 illustrates an example of a case in which power supply traces 18 wired on the board as a method of supplying power to the circuit element and a ground trace 19 that has substantially the same configuration as the power supply traces 18 but a wider width than the power supply traces 18 are used. In this case also, reflectance of noise currents can be suppressed by connecting to terminal portions 14 of the power supply traces 18 and terminal portions 14 of the ground trace 19 terminal loads 15 having an impedance the same as the characteristic impedance between the power supply layer 11 and the ground layer 12, to thereby prevent electromagnetic radiation. Further, the present invention may also be applied to a case in which the width of the power supply traces 18 is the same as the width of the ground trace 19 and a case in which the width of the ground trace 19 is narrower than the width of the power supply traces 18. That is, the present invention can be applied to portions at which power supply portions and ground portions overlap in the thickness direction of the board.

Figure 6:
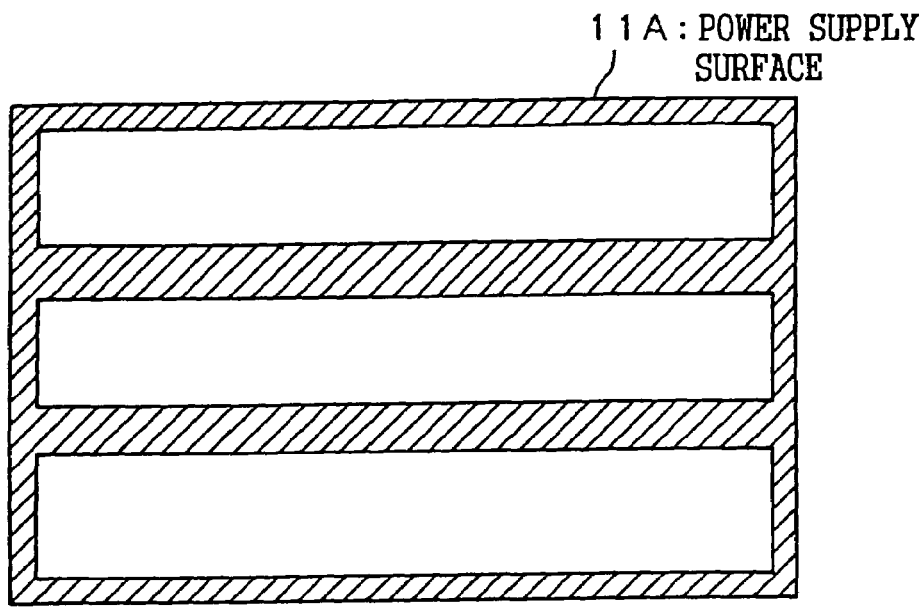
FIG. 6A is a schematic plan view of a conventional circuit board device.
FIG. 6B is a drawing for describing a current flow.
Figure 6:
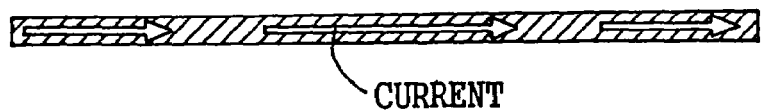

FIG. 6A shows an example of a conventional method of supplying power to the circuit element. In a case in which the power supply surface 11A is formed in a frame configuration, as shown in FIG. 6A, a noise current having a long path is generated within the power supply surface 11A, as shown in FIG. 6B, which results in electromagnetic radiation.

Therefore, as shown in FIG. 7A, when the power supply surface 11A is made discontinuous at a central portion of the board due to the formation of the slit 29, and the terminal loads 15 of the present invention are connected between the power supply layer 11 and the ground layer 12 at the terminal portions 14, the noise current path becomes shorter as shown in FIG. 7B. Moreover, when the terminal loads 15 are structured to include a resistance component, electromagnetic radiation can be suppressed because the noise current is consumed by the resistance component.

FIGS. 14A through 14D illustrate plan views of circuit board devices in which the power supply surface 11 comprises a single power supply surface, as alternative examples of the circuit board device.

Figure 14A:
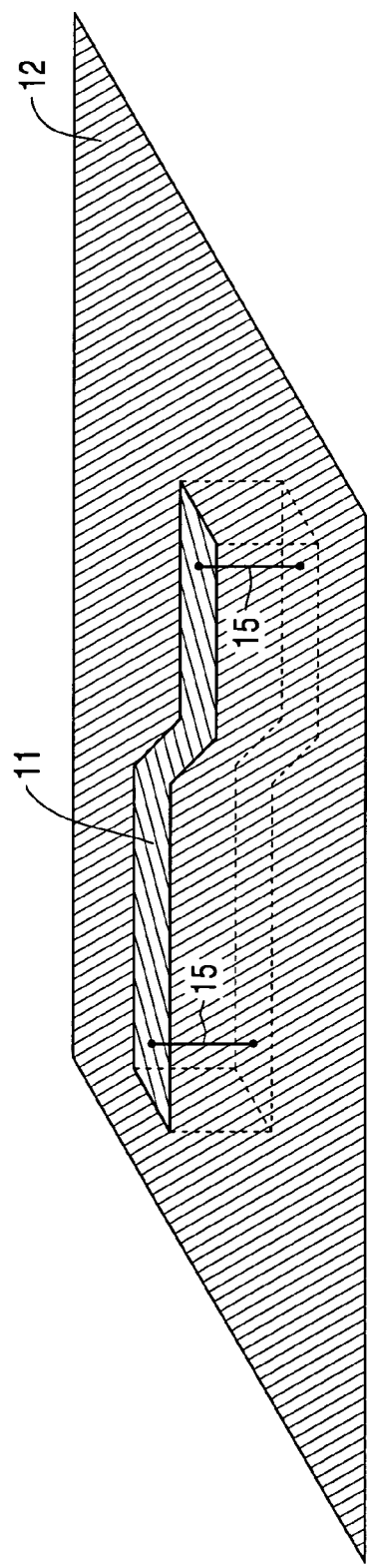
FIGS. 14A through 14D are schematic plan views of alternative examples of the circuit board device pertaining to the present invention.

Description has been given above of a case in which terminal loads are provided at power supply surface edges 13 having a peninsular configuration. However, as shown in FIG. 14A, the entirety of the power supply layer (power supply region) 11 may also have a long and narrow track configuration. In this case, terminal loads 15 may be connected between the power supply layer 11 and the ground layer 12 at both ends of regions in which the power supply layer (power supply region) 11 and the ground layer (ground region) 12 overlap (i.e., at both ends of the power supply layer 11). Further, as shown in FIG. 14A, the present invention can also be adapted to a case in which the power supply layer 11 does not completely overlap with the ground layer 12, but in which portions that do not overlap partially may be considered to be substantially overlapping.

Figure 14B:
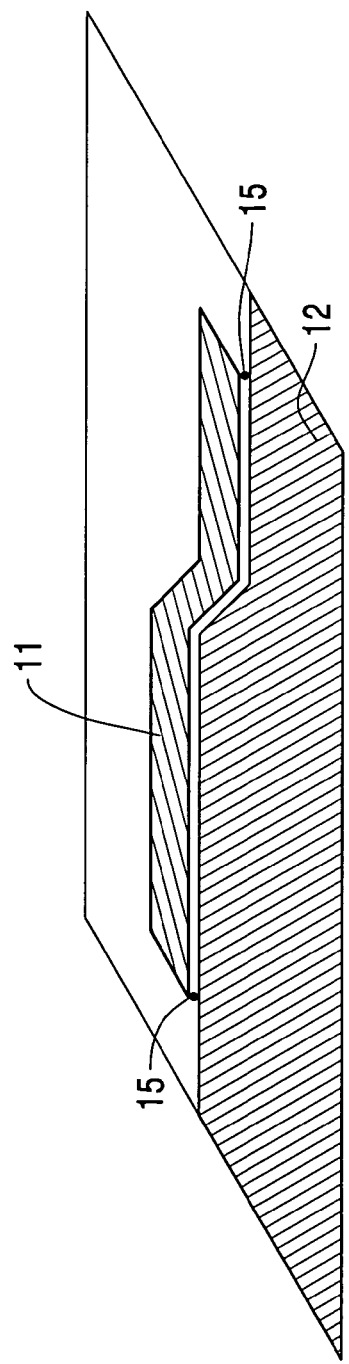
Figure 14C:
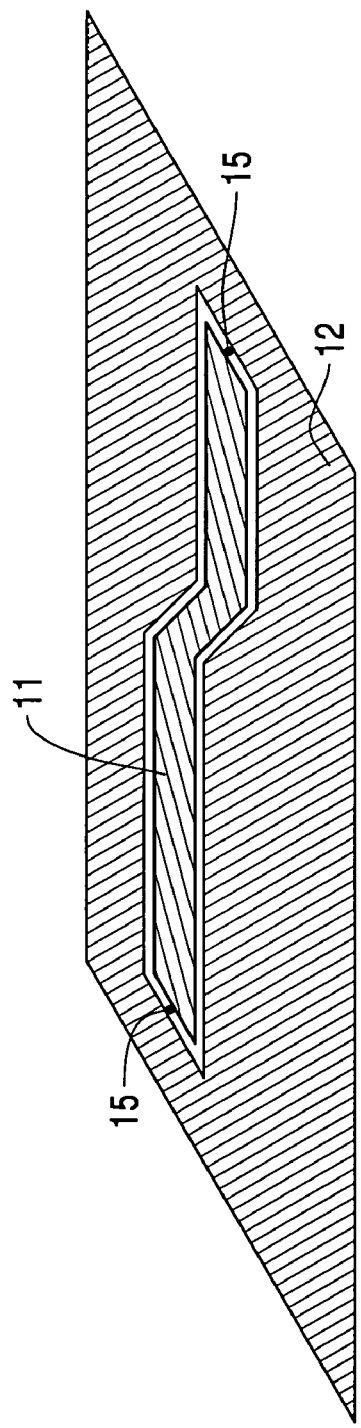
Figure 14D:
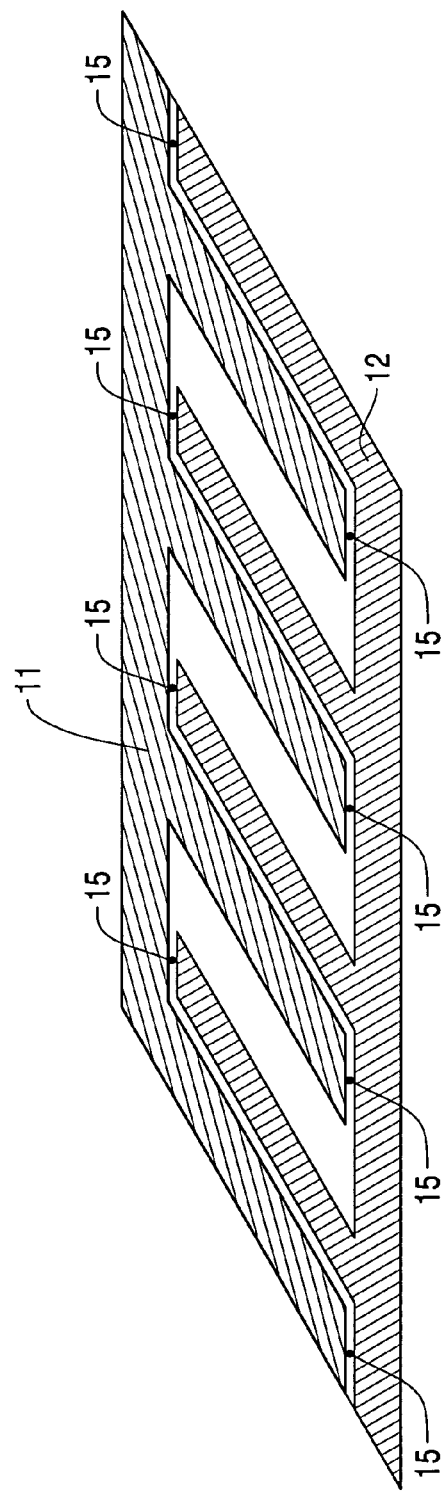

In addition, the power supply layer 11 and the ground layer 12 will perform in the same manner as if they were substantially overlapping when the power supply layer 11 and the ground layer 12 do not overlap but are contiguous when the circuit board is seen from above. For example, as shown in FIGS. 14B through 14D, the power supply region 11 and the ground region 12 are adjacent on the same insulating board (the same plane). At least one inter-region of the power supply region 11 or the ground region 12 has a shape that may be considered a track. As discussed above, this inter-region will perform in the same manner as the previous examples (where the power supply region 11 and the ground region 12 are formed in different layers with a dielectric interposed therebetween. The impedance Ze in this ease can be determined form the sectional configuration of the circuit board device in the direction orthogonal to the track direction by using a well known numerical calculation such as the finite element method or the like. In this case also, by disposing terminal loads 15 between the power supply region 11 and the ground region 12 at ends of portions of the track configuration of the ground layer, electromagnetic radiation noise can be reduced.

Further, in the case of FIGS. 14B to 14D, the present invention is not limited to a case in which the power supply region 11 and the ground region 12 are formed adjacent to one another on the same insulating board. Even in a case in which the power supply region 11 and the ground region 12 are respectively formed in different layers with the dielectric layer interposed therebetween, or even in a case in which the power supply region 11 and the ground region 12 are adjacent (contiguous) but do not overlap, these can be treated the same as a case in which they are formed on the same layer. In this case also, by providing a terminal load 15 between the power supply region 11 and the ground region 12, at an edge of the power supply region 11, electromagnetic radiation noise can be reduced.

Figure 15A:
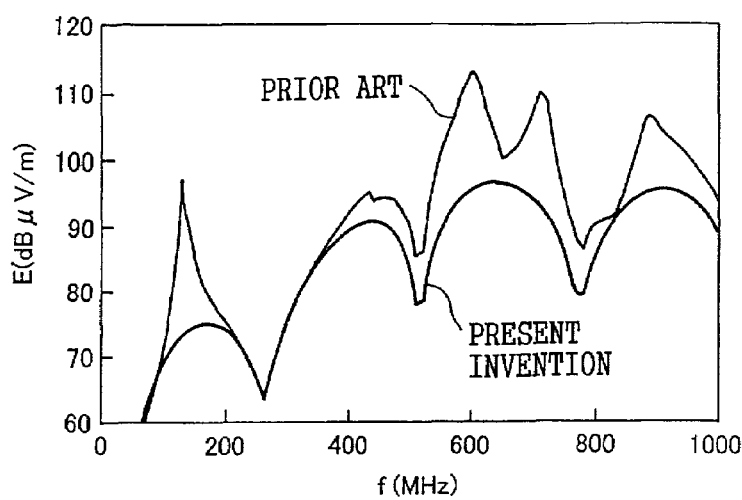
FIG. 15A is a chart illustrating a relationship between a frequency of electromagnetic radiation noise and radiation intensity.
Figure 15B:
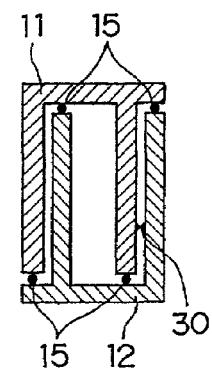
FIG. 15B is a schematic plan view of the circuit board device pertaining to the present invention.

In FIG. 15A, as shown in FIG. 15B, simulation results of electromagnetic radiation noise in a case in which terminal loads 15 are provided between the power supply layer 11 and the ground layer 12 at respective ends of portions of a track configuration of the power supply layer 11 or the ends of portions of a track configuration of the ground layer 12 when the power supply layer 11 and the ground layer 12 do not overlap but are contiguous when the circuit board device is seen from above, and a case in which none are provided, are illustrated. FIG. 15A illustrates simulation results of electromagnetic radiation when a wave source 30 is disposed at X positions of FIG. 15B. As shown in FIG. 15A, in comparison with a case in which the terminal loads 15 are not provided (prior art), electromagnetic radiation noise is greatly reduced when the terminal loads 15 are provided (the present invention). It should be noted that a 150Ω resistor and a 1000 pF capacitor are series-connected so that the impedance of the terminal loads 15 is equal to the characteristic impedance of the portion having the track configuration at a frequency of 30 MHz to 1000 MHz.

Fourth Embodiment

Next, a fourth embodiment of the present invention will be described. In the fourth embodiment, description will be given in regard to a design support device for the circuit board device described in the preceding embodiments. It should be noted that parts in common with those of previous embodiments will be designated with the same reference numerals, and detailed description thereof will be omitted.

Figure 16:
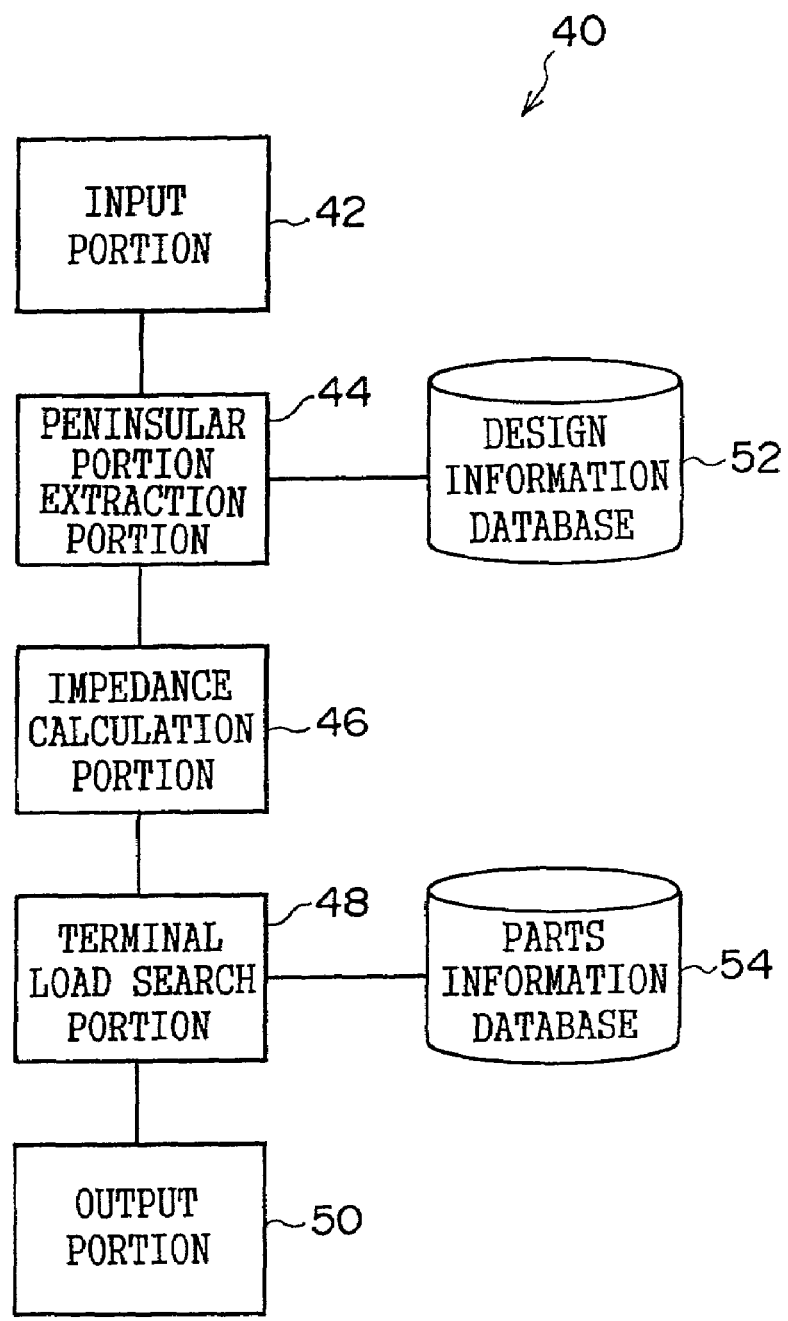
FIG. 16 is a schematic block diagram of a design support device pertaining to the present invention.

FIG. 16 is a schematic block diagram of a design support device 40. The design support device 40 comprises an input portion 42, a peninsular portion extraction portion 44, an impedance calculation portion 46, a terminal load search portion 48, an output portion 50, a design information database 52 and a parts information database 54.

The input portion 42 is structured by an input device such as a keyboard, a mouse or the like, for instructing input.

The peninsular portion extraction portion 44 extracts, on the basis of a database of design information stored in the design information database 52, a track-configured region (peninsular portion) in which the power supply layer and the ground layer in a target circuit board device overlap. The design information (artwork information) includes region information comprising, for example, three-dimensional coordinate date and the like, and attribute information indicating, for example, whether the region represented by the region information is the power supply surface or the ground surface and the like.

The impedance calculation portion 46 uses, for example, the aforementioned equation (1) to calculate the characteristic impedance of the peninsular region extracted by the peninsular portion extraction portion 44.

The terminal load search portion 48 searches, on the basis of the database of parts information stored in the parts information database 54, the most suitable terminal loads that are connected to the extracted peninsular portion. The parts information comprises, for example, information for parts used as the terminal loads such as resistors and capacitors, i.e., information relating to impedance, part size and the like (resistance, capacity).

The output portion 50 is, for example, a display, printer or storage device, and displays information about the terminal loads searched by the terminal load search portion 48, prints out the information and outputs the information to a file as electronic data.

Next, a control routine carried out by the design support device 40 as an operation of the present embodiment will be described with reference to the flow charts shown in FIGS. 17 and 18.

Figure 17:
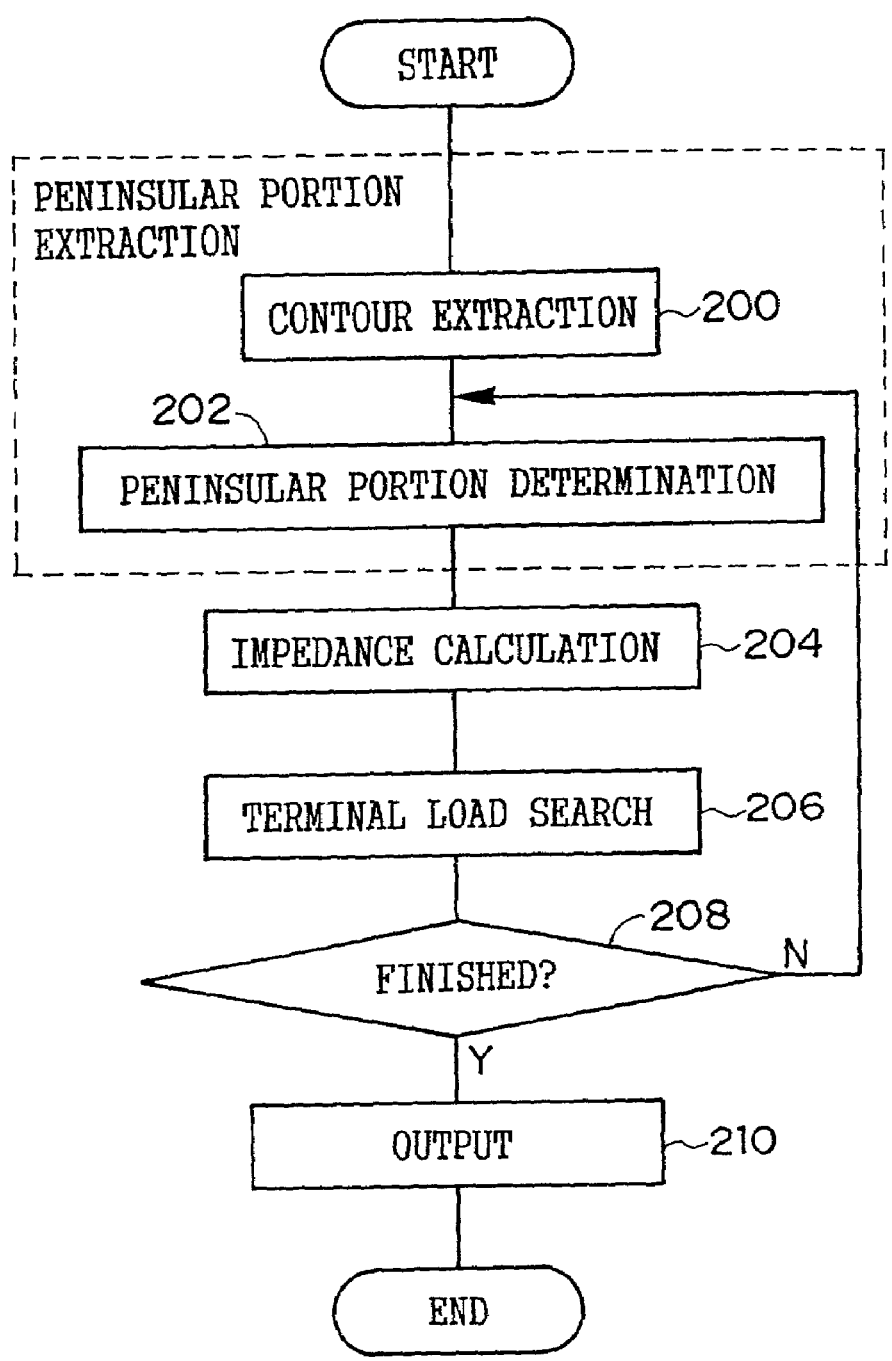
FIG. 17 is a flow chart of a control routine carried out by the design support device of the present invention.
Figure 19:
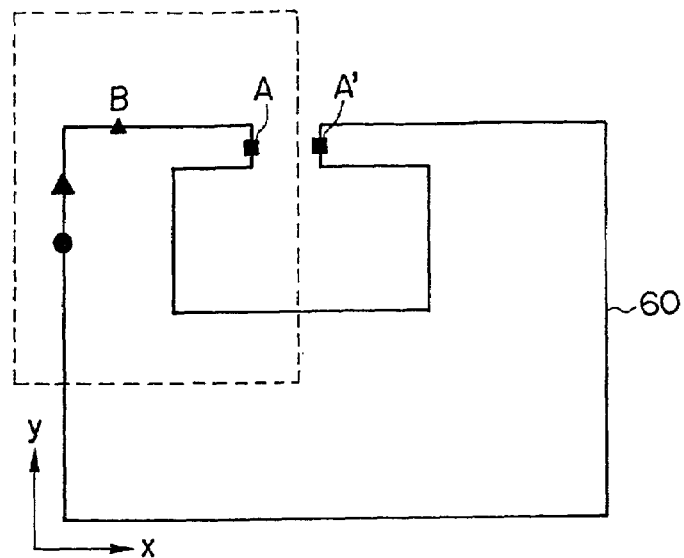
FIG. 19 is a schematic view illustrating a contour of a region in which the power supply surface and the ground surface of the circuit board device overlap.

As shown in FIG. 17, in step 200, design information (artwork information) of a target circuit board device is searched from the design information database, and (coordinate data on a contour of a region in which the power supply layer and the ground layer overlap is extracted by the peninsular portion extraction portion 44 from the region information and attribute information of the searched design information. It should be noted that the region does not have to be one in which the power supply layer and the ground layer complete overlap, but that the region may also be one in which there is partial non-overlap. That is, a region in which the two substantially overlap is extracted. With regard to the peninsular portion extraction portion 44, as shown in FIG. 19 for example, the extracted contour is converted to a contour 60 structured by only straight lines in two mutually orthogonal directions (x direction, y direction). This conversion can be realized by partitioning a region determined by the extracted contour at a square of predetermined size and making a contour of the boundary of the square positioned at the contour portion.

As shown in FIG. 19, by converting the extracted contour into the contour 60 structured by only straight lines in an x direction and a y direction, the amount of calculation of a peninsular portion determination process thereafter can be reduced, and the speed of the process can be improved.

Next, in step 202, the peninsular portion extraction portion 44 determines whether or not a peninsular portion is present in the target circuit board device.

Figure 20:
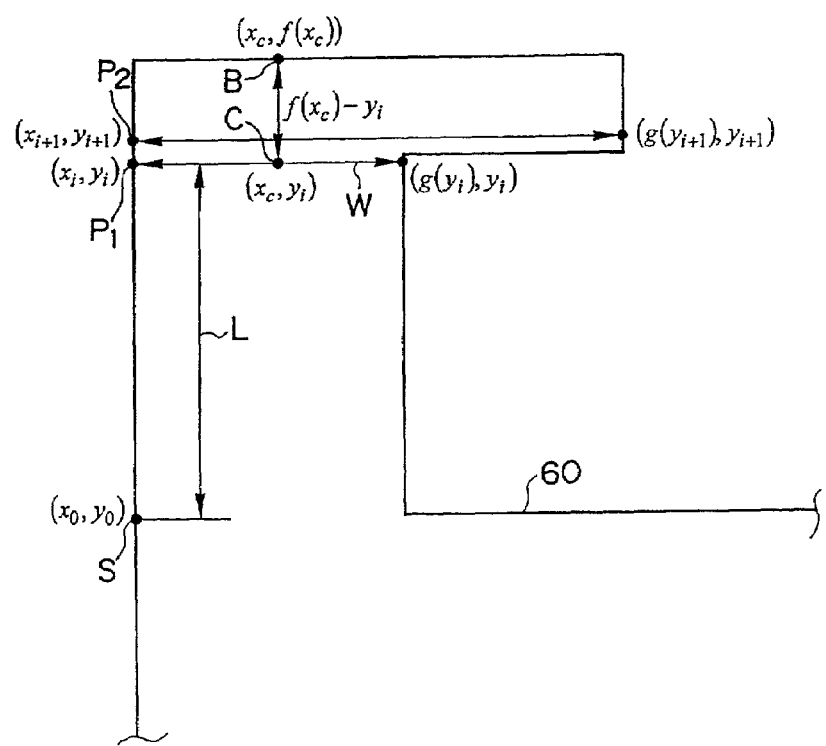
FIG. 20 is an expanded view of a portion of FIG. 19.

Description will here be given of a case in which determination of the peninsular portion is carried out on the contour 60. Reference will be made to FIG. 20, in which a dotted line portion shown in FIG. 19 has been expanded.

Figure 18:
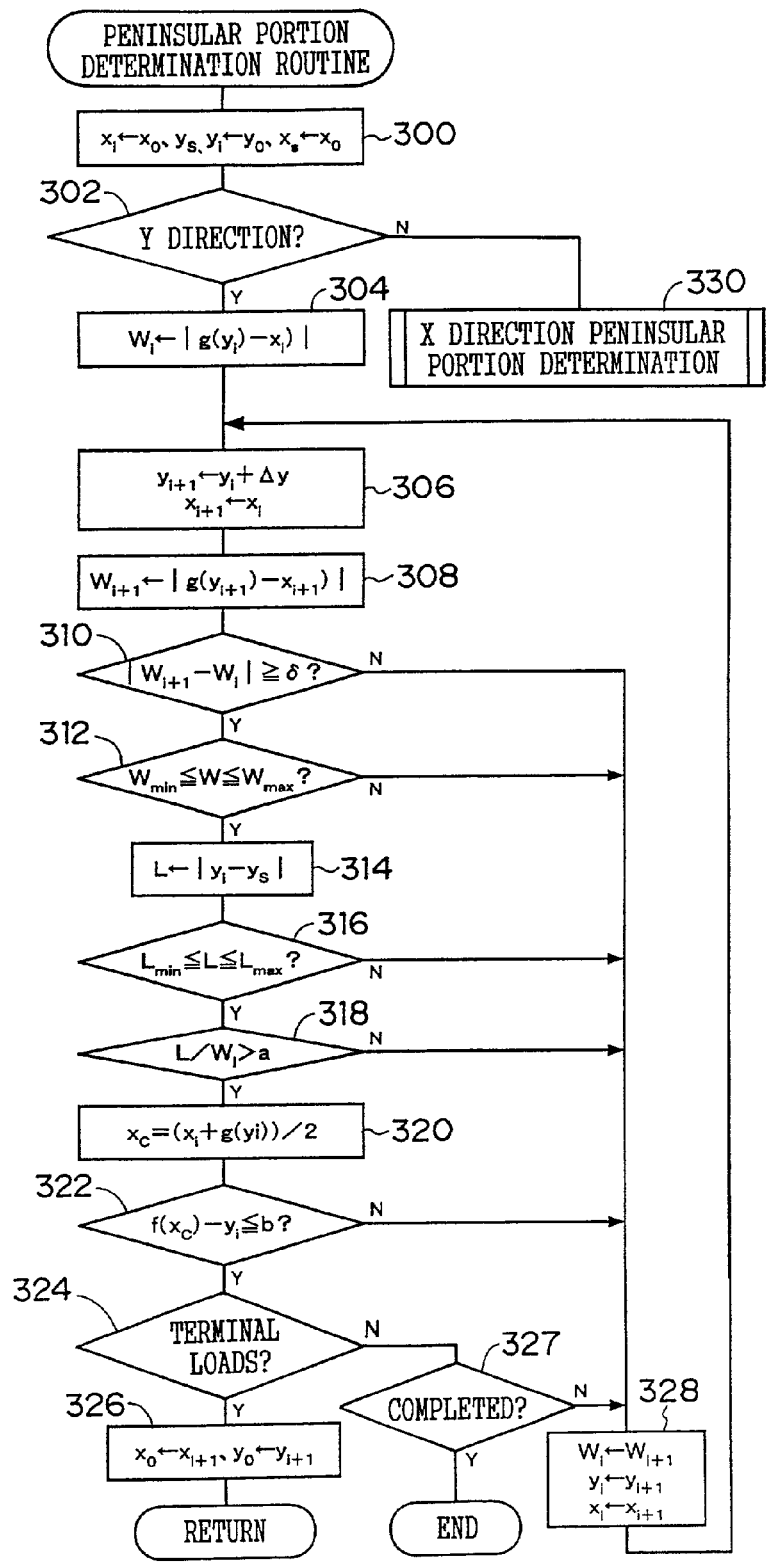
FIG. 18 is a flow chart of a peninsular portion determination routine carried out by the design support device of the present invention.

As shown in FIG. 18, initial setting is conducted in step 300. Specifically, an optional point on the extracted contour 60 (e.g., point S in FIG. 20) is determined as a starting point $(x_0, y_0)$, and this point is set to a determination point $(x_i, y_i)$. Further, variables $y_s$, $x_s$ for calculating a length of the peninsular portion are respectively set to $y_0$, $x_0$.

In the next step 302, it is judged whether or not the determination point $(x_i, y_i)$ should be moved in the y direction. Namely, it is judged from the coordinate data of the contour 60 whether or not the contour 60 is continuous in the y direction of the determination point $(x_i, y_i)$. When the contour 60 is continuous in the y direction of the determination point $(x_i, y_i)$, it is judged that the determination point $(x_i, y_i)$ should be moved in the y direction, and the process moves on to step 304. When the contour 60 is not continuous in the y direction of the determination point $(x_i, y_i)$, it is judged that the determination point $(x_i, y_i)$ should be moved in the x direction, and the routine moves on to step 330.

When it is judged that the determination point $(x_i, y_i)$ should be moved in the y direction, a width $W_i$ in the position of the determination point $(x_i, y_i)$ is calculated in step 304. Specifically, a coordinate $(g(y_i), y_i)$ of the contour 60 nearest the determination point $(x_i, y_i)$ in the x direction is determined from the coordinate data of the extracted contour 60, $|g(y_i)-x_i|$ is calculated and this is substituted for the width $W_i$.

Next, in step 306, the determination point $(x_i, y_i)$ is moved in the y direction. That is, $x_i$ is substituted with $x_i+$, and $y_i+\Delta y$ is substituted with $y_{i+1}$ to make a determination point $(x_{i+1}, y_{i+1})$. It should be noted that $\Delta y$, which is the amount in which the determination point is moved, is preset to a predetermined amount.

Next, in step 308, the width $W_{i+1}$ in the position of the determination point $(X_{i+1}, y_{i-1})$ after being moved is calculated. Specifically, the coordinate $(g(y_{1+1}), y_{i+1})$ of the contour 60 present in the x direction of the determination point $(x_{1+1}, y_{i+1})$ is determined from the coordinate data of the extracted contour 60, $|g(y_{i+1})-x_{i+1}|$ is calculated, and this is substituted for the width $W_{i+1}$.

Next, in step 310, it is judged whether or not the width has changed by at least a predetermined amount. That is, it is determined whether or not a difference between the width $W_i$ in the determination point $(x_i, y_i)$ prior to being moved and the width $W_{1+1}$ of the determination point $(X_{i+1}, y_{i+1})$ after being moved is at least a predetermined $\delta$.

When the difference between the width $W_i$ and the width $W_{1+1}$ is at least $\delta$, it is judged that the width has changed, and in step 312, it is judged whether or not the width $W_1$ is at least a lower limit $W_{min}$ and no greater than an upper limit $W_{max}$. When the width $W_1$ is at least a lower limit $W_{min}$ and no greater than an upper limit $W_{max}$, step 312 is affirmed and in step 314 a length L of the width $W_i$ region is determined. That is, $|y_i-y_s|$ is calculated and substituted for L. When the difference between the width $W_1$ and the width $W_{i+1}$ is less than $\delta$, it is regarded as a fixed width and the routine moves on to step 328. Further, when the width $W_i$ is not at least $W_{min}$ and not no greater than $W_{max}$, the routine moves on to step 328.

For example, when the determination point has moved from a position P1 to a position P2, as shown in FIG. 20, the length L is calculated in step 114 because the width has changed by at least the predetermined amount.

Next, in step 316, it is judged whether or not the length L of the determined fixed width region is within a predetermined range, i.e., whether or not the length L is at least a lower limit $L_{min}$ and no greater than an upper limit $L_{max}$. When the length L is at least the lower limit $L_{min}$ and no greater than the upper limit $L_{max}$, step 316 is affirmed, and in step 318 it is judged whether or not the ratio $L/W_i$ of the length L and the width $W_i$ is at least a threshold a, i.e., whether or not the ratio is a peninsular portion. It should be noted that the threshold a is set to a value greater than 1, but that the threshold is appropriately set in accordance with the number, board size, complexity of the shapes of the power supply surface and ground surface, etc., of the noise origin in the target circuit board device. The smaller the threshold a, more are the regions judged to be peninsular portions, and the greater the threshold a, less are the regions judged to be peninsular portions.

When the ratio $L/W_i$ is at least the threshold a, step 318 is affirmed and in step 320 an x coordinate $x_c$ of a middle point (e.g., point C in FIG. 20) of the fixed width region in the x direction is determined. That is, $(x_i+g(y_i))/2$ is calculated and substituted for $x_c$. Next, in step 322, it is judged whether or not a distance from the middle point $(x_c, y_i)$ to the end of the y direction (direction of movement) is no greater than a threshold b. That is, a y coordinate of the contour 60 present in the y direction of the middle point $(x_c, y_i)$ is made $f(x_c)$, $f(x_c)-y_i$ is calculated as a distance to the end (point B in FIG. 20), and it is judged whether this is no greater than the threshold b. The threshold b can be set by an absolute value, set as a function of the length L of the region having the fixed width, or set to combine both. When set as a function of the length L, the threshold b is set, for example, to satisfy b<1, b<L/2.

When the distance from the middle point C ($x_c$, $y_i$) to point B ($x_c$, $f(x_c)$) is no greater than the threshold b, it is judged to be a peninsular portion, and in step 324 it is judged whether or not a terminal load is disposed in the vicinity of point B from the design information and the like. When a terminal load is not disposed, the determination point ($x_{i+1}$, $y_{i+1}$) is set to the starting point ($x_0$, $y_0$) in step 326 for the next peninsular portion determination, whereby the routine returns.

When a terminal load is disposed in the vicinity of point B, step 324 is negated, and in step 327 it is judged whether or not the determination of peninsular portions for all of the contour 60 has been completed. When the determination has been completed, the control routine is concluded.

When any of steps 310, 312, 316, 318, 322 and 327 is negated, the routine proceeds to step 328, the determination point ($X_{i+1}$, $y_{i-1}$) is set to the determination point ($x_i$, $y_i$) and the width $W_{i+1}$ is set to $W_i$. Further, the routine returns to step 306 and the process is repeated in the same manner as above.

When step 302 is negated, the routine proceeds to step 330 and determination of the peninsular portion is carried out while the determination point is moved in the x direction. Since step 330 is a process carried out in the same manner as steps 304 to 328 and x, y are substituted in each step and processed similarly, description thereof will be omitted.

By processing in this manner, in the case of the contour 60 such as shown in FIG. 19, terminal loads are set as positions to be connected not only in regard to positions at the tips of the peninsular portions such as point A and point A' but positions in which a peninsular portion is present in the tip such as point B.

When step 202 in FIG. 17 is concluded (i.e., when it is judged that there is a peninsular portion), in step 204 the characteristic impedance Ze of the region judged to be a peninsular portion is calculated in accordance with the above equation (1) by the impedance calculation portion 46. It should be noted that the characteristic impedance may be calculated by a well known numerical calculation such as the finite element method and the boundary element method.

Next, in step 206, a terminal load having an impedance that is largely equal to the calculated impedance Ze is searched from the parts information database 54 by the terminal load search portion 48.

Specifically, parts that satisfy, for example, the following expressions (5) to (7) are searched.

$$ze/5 \leq R \leq 5 \cdot Ze \quad (5)$$

$$C \leq 1/(10\pi \cdot f_{min} \cdot Ze) \quad (6)$$

$$L_0 \leq 5 \cdot Ze/(2\pi \cdot f_{max}) \quad (7)$$

In the above expressions, R is a resistance, C is a capacity, $f_{min}$ is a lower limit of a frequency of noise radiation of a reduction target, $f_{max}$ is an upper limit of a frequency of noise radiation of a reduction target, $L_0$ is the sum total of inductance constituents present in the resistor, the capacitor, and the connection pattern that connects the resistor and the capacitor.

That is, when a resistor and a capacitor are used at the terminal load, a resistor in which the resistance R satisfies the above expression (5) is searched from the parts information database, and a capacitor in which the capacity C satisfies the above expression (6) is searched from the parts information database. In this case, these are searched taking the above expression (7) into account. Namely, a resistor and capacitor that satisfy the conditions of the above expressions (5) and (6) and in which the sum total $L_0$ of inductance constituents present in the resistor, the capacitor, and the connection pattern that connects the resistor and the capacitor satisfies the above expression (7) are searched.

By satisfying the above expression (5), an impedance resulting from the resistor becomes an impedance substantially equal to the characteristic impedance Ze (at least ⅕ and no greater than 5 times the characteristic impedance Ze) across the entire frequency range.

Further, by satisfying the above expression (6), an impedance resulting from the capacity of the capacitor becomes an impedance substantially no greater than the characteristic impedance Ze (no greater than 5 times the characteristic impedance Ze) across the entire frequency range.

Further, by satisfying the above expression (7), an impedance resulting from inductance present in the resistor, the capacitor, and the connection pattern that connects the resistor and the capacitor becomes an impedance substantially no greater than the characteristic impedance Ze (no greater than 5 times the characteristic impedance Ze) across the entire frequency range.

Accordingly, by selecting a resistor and capacitor that satisfy the above expressions (5) to (7) and setting the connecting pattern for the resistor and capacitor, the impedance of all terminal loads can be largely made equal to the characteristic impedance Ze. Namely, the condition $0.1 \leq Zr/Ze \leq 110$ can be satisfied.

The values to which the resistance R, the capacity C and the inductance $L_0$ are set are appropriately set in accordance with various conditions, but by selecting a terminal load that most preferably satisfies R=Ze, $C \geq 1/(2\pi \cdot f_{min} \cdot Ze)$, and $L_0 \leq Ze/(2\pi \cdot f_{max})$, an excellent impedance across the entire frequency range can be obtained.

It should be noted that the resistor and capacitor can easily be selected from the parts information database 54. However, selection of the inductance $L_0$ is conducted, for example, as follows. That is, it is possible, for example, to lessen the inductance constituents present in the resistor and the capacitor by selecting parts having a small size from the parts information database. Further, it is possible to lessen the inductance constituents present in the resistor and the capacitor by shortening the length of inter-layer connection parts for connecting respective layers and widening the width of inter-layer connection parts and connection patterns when forming connection patterns and connection patterns across each layer by parallel-connecting the connection patterns and inter-layer connection parts and the like.

When the terminal load to be connected to the peninsular portion is searched in this manner, it is determined in the next step 208 whether or not the determination of peninsular portions and the searching of terminal loads for all of the contour 60 has been completed. When these have not been completed, the process returns to step 202 and is carried out in the same manner as above.

When the determination of peninsular portions has been completed for all of the contour 60, the information for the searched terminal loads is displayed as image data or a list, printed, and outputted to a file as electronic data, and the searched terminal load is added to the design information database in step 210.

FIG. 21A shows simulation results of electromagnetic radiation noise in cases when, in a circuit board device having the contour 60 such as illustrated in FIG. 21B, no terminal loads are provided (prior art: thin line), a terminal load is provided only at point A (present invention: dotted line), and when terminal loads are provided at both point A and point B (present invention: thick line).

As shown in FIG. 21A, in comparison with a conventional case in which no terminal loads are connected, electromagnetic radiation noise is reduced when a terminal load is connected at point A, and electromagnetic radiation noise is further reduced when terminal loads are connected at both point A and point B.

Further, an impedance spectral when a terminal load in which a resistor having a resistance of 4.7Ω and a capacitor having a capacity of 100 pF are series-connected (Comparative Example), an impedance spectral when a 100 pF capacitor is used at the terminal load to satisfy the above expression (6) when a frequency range that is largely equal to the characteristic impedance Ze is 30 MHz to 1000 MHz (Example 1), and an impedance spectral when a 0.1 µF capacitor is used at the terminal load to satisfy the above expression (6) and parts and connection patterns are selected to satisfy the above expression (7) (Example 2) are shown in FIG. 22 when the characteristic impedance Ze of the extracted peninsular portion is 5Ω.

As shown in FIG. 22, in comparison with the Comparative Example, the impedances in Examples 1 and 2 are largely equal to the characteristic impedance Ze across a wide frequency range. Particularly in Example 2, the impedance is largely equal to the characteristic impedance Ze across the entire frequency range.

By selecting terminal loads that satisfy the above expressions (5) to (7) in this manner, the impedance of the terminal load can be made largely equal to the characteristic impedance Ze across a wide frequency range, and electromagnetic radiation noise can be reduced across a wide frequency range.

Because the position to which the terminal load is to be connected can be determined automatically and the most appropriate terminal load can be searched, design of the circuit board device becomes easy and design labor can be greatly reduced.

It should be noted that, although the most preferable circuit board device is the structure illustrated in FIG. 16, the circuit board device may also be structured of only the peninsular portion extraction portion 44, the impedance calculation portion 46 and the design information database 52.

EXAMPLES

Examples of the present invention will be described hereinafter.

Figure 8:
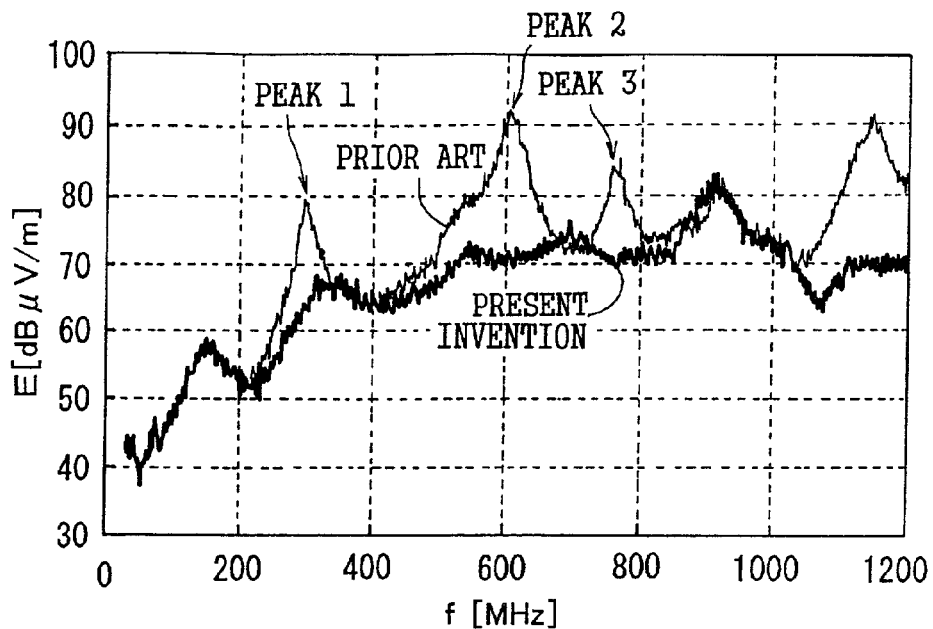
FIG. 8 is a chart illustrating results of measurements of electromagnetic radiation in the circuit board device pertaining to the second embodiment.

FIG. 8 shows results when electromagnetic radiation was measured for the circuit board device 10 described in the first embodiment. The circuit board device 10 used in the measurement had a size of 170 mm×110 mm, a distance h between the power supply layer 11 and the ground layer 12 was 1.6 mm, a width of the slit 29 was 1 mm, a conductor width W of the power supply surface edges 13 was 5 mm, a length L of the left-hand power supply surface edge 13 in FIG. 1 was 45 mm and a length L of the right-hand power supply surface edge 13 in FIG. 1 was 30 mm.

In this case, L/W in each of the left-hand and right-hand power supply surface edges 13 was 9.6. Further, the conductor width of the power supply surface edge 13 was 5 mm, a distance h between the power supply layer 11 and the ground layer 12 was 1.6 mm, a relative dielectric constant of the dielectric present between the power supply layer 11 and the ground layer 12 was 4.7, so that when the characteristic impedance Ze of the power supply surface edges 13 was calculated using the above equation (1), the characteristic impedance was roughly 35Ω.

In FIG. 8, measurement values of radiation noise spectrals are indicated for a prior art case in which no processes were carried out on the terminal load 14 of the power supply surface edge 13 and for a case in which terminal loads 15 having a structure in which a 33Ω resistor 16 and a 0.1 µF capacitor 17 were parallel-connected at terminals 14 of both power supply surfaces edges 13.

As is clear from FIG. 8, by providing the terminal loads 15 of the present invention, electromagnetic radiation noise could be reduced across a wide frequency range and large electromagnetic radiation noise of nearly 20 dB at a maximum could be reduced.

Next, in order to make clear the relationship between the impedance value of the terminal loads 15 and the effect of reducing electromagnetic radiation noise, a resistance R of the resistor 16 in the terminal load 15 taken as a variable and changes in the radiation intensity of the electromagnetic radiation noise at frequencies of peaks 1–3 in FIG. 8 were measured. The results are shown in FIG. 9.

Figure 9:
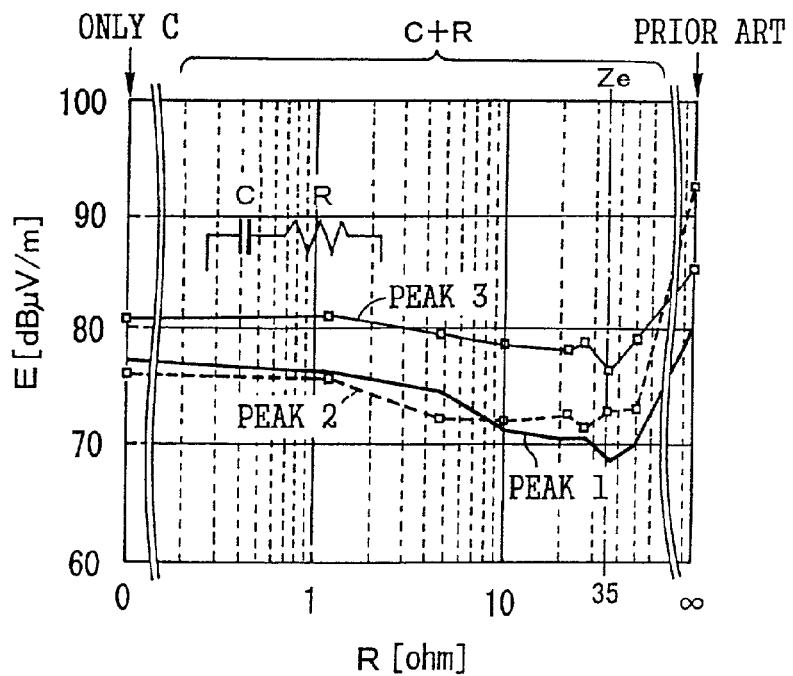
FIG. 9 is a chart illustrating results of measurements of electromagnetic radiation in the circuit board device pertaining to the second embodiment.

In FIG. 9, changes in the radiation intensity of the electromagnetic radiation noise at frequencies of peaks 1–3 in which the resistance R was in a range of 0–∞ (infinity) are shown. Here, it can be said that when the resistance R is 0, the terminal load 15 consists only of the capacitor 17, and when the resistance is ∞, the terminal load 15 is not present (i.e., it is the same as the conventional technology).

As is clear from FIG. 9, in whatever peak frequency, the radiation intensity when only the capacitor 17 was used (resistance R=0) as the terminal load 15 was greatly reduced as compared to the case of the conventional technology (resistance R=∞). Further, by using as the terminal load 15 a terminal load in which the resistor 16 and the capacitor 17 are parallel-connected, radiation noise was further reduced. Particularly, electromagnetic radiation noise was most reduced at the vicinity in which the resistance R equaled the characteristic impedance Ze (=35Ω). Moreover, the effect became smaller when the resistance R exceeded twice the characteristic impedance Ze.

It should be noted that, in regard to the resistor 16, the capacitor 17 and the connection patterns (electrode patterns) for connecting the resistor 16 and the capacitor 17 used in the present invention, those in which the inductance constituent therein was extremely small were used, and it was confirmed that the impedance was less than 1Ω in the measured frequency range.

Figure 10:
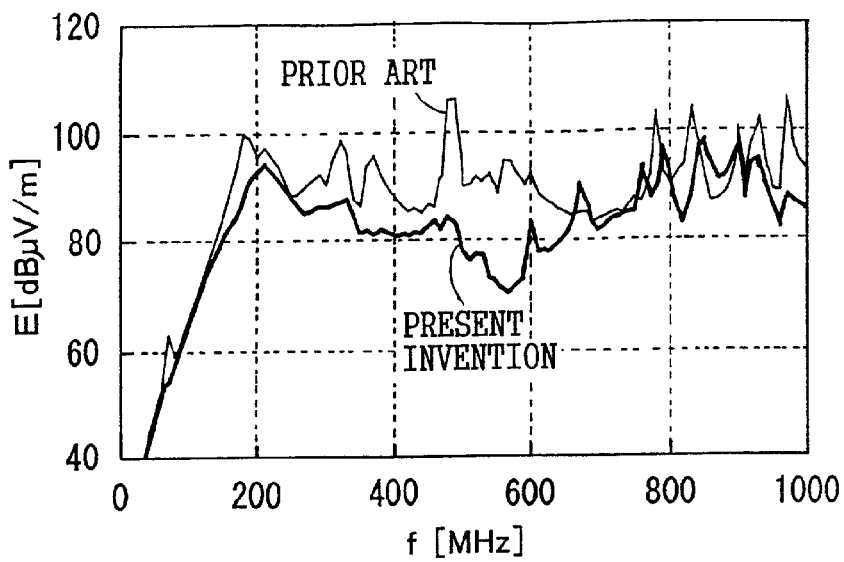
FIG. 10 is a chart illustrating simulation results of electromagnetic radiation in the circuit board device pertaining to the second embodiment.

Next, FIG. 10 shows results in which electromagnetic radiation for a circuit board device 10 that was the same in outward appearance as the circuit board device used in the preceding experiment but in which the distance between the power supply layer 11 and the ground layer 12 was different was calculated by simulation. In the circuit board device 10 used in the measurement, the size thereof was 260 mm×230 mm, a distance h between the power supply layer 11 and the ground layer 12 was 0.2 mm, a width of the slit 29 was 1 mm, a conductor width W of the power supply surface edge 13 was 10 mm, a length L of the left-hand power supply surface edge 13 was 105 mm and a length L of the right-hand power supply surface edge 13 was 30 mm.

In this case, L/W in the left-hand and right-hand power supply surface edges 13 were respectively 10.5 and 3.

Further, the conductor width of the power supply surface edge 13 was 10 mm, a distance h between the power supply layer 11 and the ground layer 12 was 0.2 mm, a relative dielectric constant of the dielectric present between the power supply layer 11 and the ground layer 12 was 4.7, so that when the characteristic impedance Ze of the power supply surface edges 13 was calculated using the above equation (1), the characteristic impedance was roughly 3.30.

In FIG. 10, results of radiation noise spectrals calculated by simulation in accordance with a moment method are indicated for convention art case in which no processes are carried out on the terminal load 14 of the power supply surface edge 13 and for a case in which terminal loads 15 having a structure in which a 5Ω resistor 16 and a 0.1 μF capacitor 17 were parallel-connected at terminals 14 of both power supply surfaces edges 13.

As is clear from FIG. 10, by providing the terminal loads 15 of the present invention, electromagnetic radiation noise could be reduced across a wide frequency range and large electromagnetic radiation noise of nearly 22 dB at a maximum could be reduced.

Next, in order to make clear the relationship between the impedance value of the terminal loads 15 and the effect of reducing electromagnetic radiation noise, a resistance R of the resistor 16 in the terminal load 15 was taken as a variable and changes in the radiation intensity of the electromagnetic radiation noise when the frequencies in FIG. 10 were 200 MHz and 600 MHz were measured. The results are shown in FIG. 11.

Figure 11:
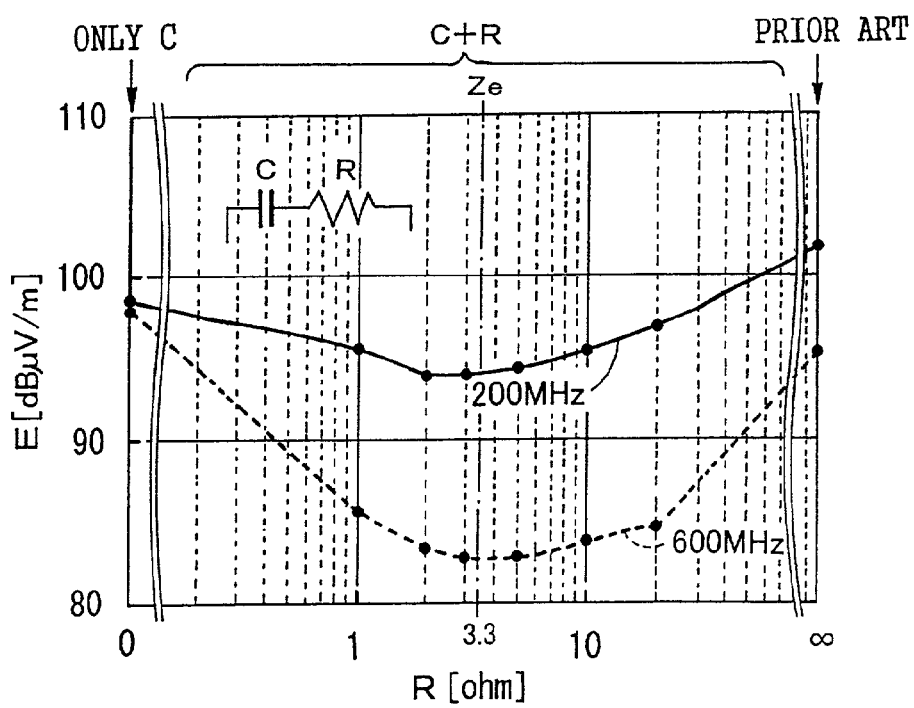
FIG. 11 is a chart illustrating simulation results of electromagnetic radiation in the circuit board device pertaining to the second embodiment.
Figure 12:
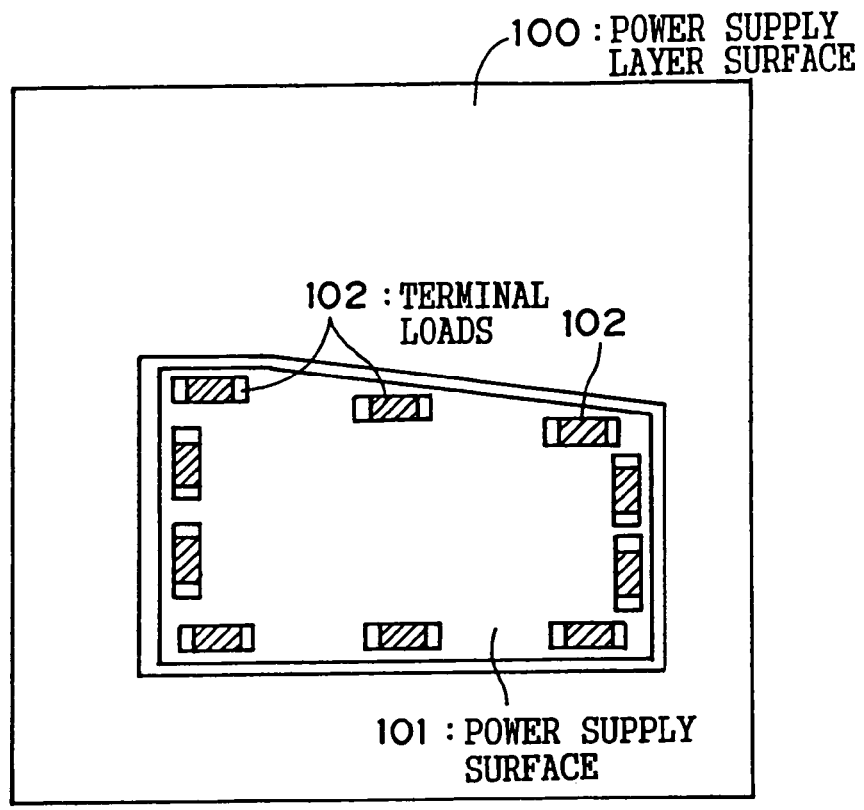
FIG. 12 is a schematic plan view of a conventional circuit board device.

As is clear from FIG. 11, in whatever peak frequency, the radiation intensity when only the capacitor 17 was used as the terminal load 15 (resistance R=0) was greatly reduced as compared to the case of the conventional technology (resistance R=∞). Further, by using as the terminal load 15 a terminal load in which the resistor 16 and the capacitor 17 are parallel-connected, radiation noise was further reduced. Particularly, electromagnetic radiation noise was most reduced at the vicinity in which the resistance R equaled the characteristic impedance Ze (=35Ω). Moreover, the effect became smaller when the resistance R exceeded ten times the characteristic impedance Ze.

Figure 23:
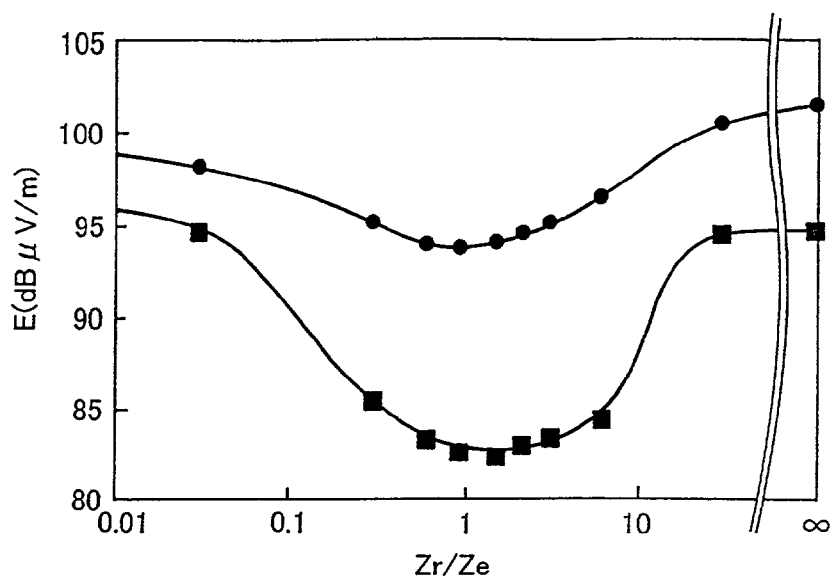
FIG. 23 is a chart in which a characteristic impedance and terminal load impedance of the present invention are compared, and in which a relationship between a frequency of electromagnetic radiation noise and radiation intensity are illustrated.

Next, the results when the horizontal axis of FIG. 11 was substituted for the resistance R and the ratio of the characteristic impedance Ze to the terminal load 15 impedance Zr was expressed as Zr/Ze to show a relationship between this and the radiation intensity of the electromagnetic radiation noise are shown in FIG. 23.

As is clear from FIG. 23, electromagnetic radiation noise was reduced the greatest when Zr/Ze was 1, i.e., when the impedance Zr of the terminal load 15 was equal to the characteristic impedance Ze of the power supply surface edges 13. When Zr/Ze was no less than 0.1 and no greater than 10, there was an electromagnetic radiation noise reducing effect. However, is preferable the impedance of the terminal loads 15 is selected so that Zr/Ze is no less than 0.3 and no greater than 3.

Figure 24:
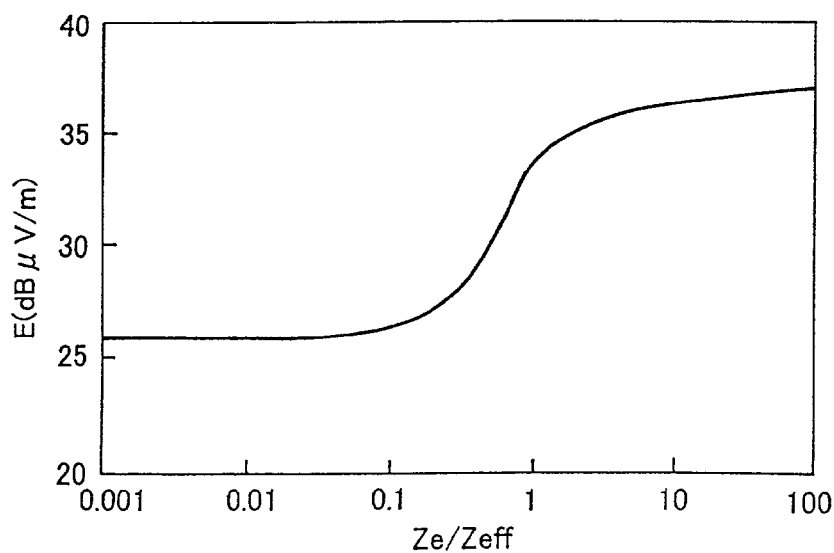
FIG. 24 is a chart in which a characteristic impedance and terminal load impedance of conventional technology are compared, and in which a relationship between a frequency of electromagnetic radiation noise and radiation intensity are illustrated.

In order to compare FIG. 5 of JP-A No. 11-54860 with FIG. 23, the results when the horizontal axis of FIG. 5 of JP-A No. 11-54860 was substituted for the capacitor capacity C and the ratio of the effective characteristic impedance Zeff to the impedance Ze of the load was expressed as Ze/Zeff to show a relationship between this and the radiation intensity of the electromagnetic radiation noise are shown in FIG. 24. The technology disclosed in JP-A No. 11-54860 is a technology in which electromagnetic radiation from the power supply surface and the ground surface is prevented by considering the planar power supply surface and the ground surface as a collective of equivalent transmission paths for the characteristic impedance Zeff and providing, with intervals provided therebetween, a plurality of loads having an impedance Ze which is smaller than the characteristic impedance Zeff in the edges of the power supply surface and ground surface.

As is clear from FIG. 24, in the case of the technology disclosed in JP-A No. 11-54860, the electromagnetic radiation when the impedance Ze of the load equaled the effective characteristic impedance Zeff was strong, and an effect of reducing radiation noise in the case of satisfying Ze/Zeff≦0.1 was clearly apparent.

In contrast, in the present invention, as is clear from FIG. 23, there is an effect of reducing electromagnetic radiation noise when Zr/Ze is no less than 0.1 and no greater than 10. In comparison with the technology disclosed in JP-A No. 11-54860, the structure and operation of the present invention are not only different but have a remarkable effect.

As described above, according to the invention of the aspect, there is the effect that the reflectance of a noise current concentrating at the portion of the track configuration at which the width become narrow can be suppressed, whereby electromagnetic radiation can be suppressed, so that there is no longer the need to connect many terminal loads between the power supply layer and the ground layer, and the regions of mountable portions on the circuit board can be prevented from being reduced.

According to the invention of the second aspect, there is the effect that the power supply layer and the ground layer can be prevented from short-circuiting at high frequency regions.

In addition, according to the invention of the seventh aspect, there is the effect that the design of the circuit board device not only becomes simpler, but labor hours can be reduced.

What is claimed is:

1. A circuit board device having a power supply region and a ground region adjacent to the power supply region, wherein, when divided into two or more power supply region by a slit, at least one region of said two or more power supply regions and the ground region that are adjacent is in the shape of has a shape that may be considered a track having a length that is larger than its width, a terminal element having an impedance that is substantially equal to a characteristic impedance between said at least one region and said ground region is connected between said power supply region and said ground region at a terminal end of said at least one region, wherein the terminal element includes a resistor and a capacitor which are series-connected, a relationship between the characteristic impedance Ze and a resistance R of the resistor satisfies (Ze/5)≦R≦(5·Ze), and a capacity C of the capacitor satisfies C≦1/(10π·$f_{min}$·Ze), where $f_{min}$ is a lower limit of a radiation noise frequency of a reduction target.

2. The circuit board device according to claim 1, further comprising a dielectric layer, wherein the power supply region and the ground region that are adjacent are formed in different layers with the dielectric layer interposed therebetween and substantially oppose one another and overlap.

3. The circuit board device according to claim 1, further comprising a circuit, which has a plurality of via holes that forms a parallel circuit, formed adjacent to the terminal portion, and the terminal element is connected between the layer via the parallel circuit.

4. The circuit board device according to claim 1, wherein the terminal element includes a capacitor.

5. The circuit board device according to claim 1, wherein the terminal element includes a resistor and a capacitor which are series-connected.

6. The circuit board device according to claim 1, wherein the impedance Zr of the terminal element is set such that the characteristic impedance Ze and the impedance Zr of the terminal element satisfy a relationship $0.1 \leq Zr/Ze \leq 10$.

7. The circuit board device according to claim 1, wherein the slit has a T-shape.

8. The circuit board device according to claim 1, wherein terminal element is connected between said power supply region and said ground region only at said terminal end of said at least one region.

9. The circuit board device according to claim 1, wherein an outer periphery of said power supply region and said ground region is free from connection by said terminal element.

* * * * *